(12) United States Patent
Cheng et al.

(10) Patent No.: US 10,985,063 B2
(45) Date of Patent: *Apr. 20, 2021

(54) SEMICONDUCTOR DEVICE WITH LOCAL CONNECTION

(71) Applicant: International Business Machines Corporation, Armonk, NY (US)

(72) Inventors: Kangguo Cheng, Schenectady, NY (US); Lawrence A. Clevenger, Saratoga Springs, NY (US); Carl Radens, LaGrangeville, NY (US); Junli Wang, Slingerlands, NY (US); John H. Zhang, Altamont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/542,595

(22) Filed: Aug. 16, 2019

(65) Prior Publication Data

US 2020/0027787 A1    Jan. 23, 2020

Related U.S. Application Data

(63) Continuation of application No. 16/042,585, filed on Jul. 23, 2018, now Pat. No. 10,438,850.

(51) Int. Cl.
*H01L 21/70* (2006.01)
*H01L 21/768* (2006.01)
(Continued)

(52) U.S. Cl.
CPC .. *H01L 21/76897* (2013.01); *H01L 21/76895* (2013.01); *H01L 21/823835* (2013.01); *H01L 27/092* (2013.01)

(58) Field of Classification Search
USPC ........................................... 257/369
See application file for complete search history.

(56) References Cited

U.S. PATENT DOCUMENTS 5,953,614 A    9/1999  Liu et al.
8,183,644 B1   5/2012  Chaung et al.
(Continued)

OTHER PUBLICATIONS

Carmona, M. et al., "Study of gate contact over active area," 29th Symposium on Microelectronics Technology and Devices (SBMicro), 2014, 4 pages.

(Continued)

*Primary Examiner* — Niki H Nguyen
(74) *Attorney, Agent, or Firm* — Cantor Colburn LLP; Joseph Petrokaitis

(57) ABSTRACT

A first TS is coupled to first S/D over first fin, second TS coupled to second S/D over first fin, third TS coupled to third S/D over second fin, fourth TS coupled to fourth S/D over second fin, gate metal over first and second fins, and gate cap over gate metal. First TS cap is on first TS, second TS cap on second TS, third TS cap on third TS, and fourth TS cap on fourth TS. ILD is formed on top of gate cap and first through fourth TS caps. First opening is through ILD and second TS cap such that part of gate metal is exposed, after removing part of gate cap. Second opening is through ILD to expose another part of gate metal. Combined gate metal contact and local metal connection is formed in first opening and individual gate metal contact is formed in second opening.

18 Claims, 26 Drawing Sheets

(51) Int. Cl.
*H01L 27/092* (2006.01)
*H01L 21/8238* (2006.01)

(56) References Cited

U.S. PATENT DOCUMENTS

| | | | |
|---|---|---|---|
| 8,564,030 | B2 | 10/2013 | Schultz |
| 9,006,100 | B2 | 4/2015 | Rashed et al. |
| 9,299,795 | B2 | 3/2016 | Guo et al. |
| 9,496,361 | B1 | 11/2016 | Tung et al. |
| 9,536,982 | B1 | 1/2017 | Cheng et al. |
| 9,666,533 | B1 | 5/2017 | Basker et al. |
| 9,780,178 | B2 | 10/2017 | Kie et al. |
| 9,818,651 | B2 | 11/2017 | Bouche et al. |
| 9,824,921 | B1 | 11/2017 | Labonte et al. |
| 10,438,850 | B1 * | 10/2019 | Cheng ............. H01L 21/823835 |
| 10,756,114 | B2 * | 8/2020 | Liaw .................. H01L 23/5283 |
| 2008/0079090 | A1 | 4/2008 | Hwang et al. |
| 2011/0227170 | A1 | 9/2011 | Zhu et al. |
| 2012/0104514 | A1 | 5/2012 | Park et al. |
| 2013/0005133 | A1 | 1/2013 | Lee et al. |
| 2013/0043516 | A1 | 2/2013 | Han et al. |
| 2013/0240990 | A1 | 9/2013 | Yin et al. |
| 2013/0320412 | A1 | 12/2013 | Yamasaki |
| 2013/0328199 | A1 | 12/2013 | Yun et al. |
| 2014/0103403 | A1 | 4/2014 | Kim et al. |
| 2015/0060960 | A1 | 3/2015 | Xie et al. |
| 2015/0221733 | A1 | 8/2015 | Hsieh |
| 2015/0243544 | A1 | 8/2015 | Alptekin et al. |
| 2015/0270176 | A1 | 9/2015 | Xie et al. |
| 2016/0336183 | A1 * | 11/2016 | Yuan .................... H01L 29/401 |
| 2016/0358916 | A1 | 12/2016 | Adusumilli et al. |
| 2016/0365424 | A1 | 12/2016 | Basker et al. |
| 2016/0372332 | A1 | 12/2016 | Pranatharthiharan et al. |
| 2017/0263557 | A1 | 9/2017 | Clevenger et al. |
| 2017/0263715 | A1 | 9/2017 | Bouche et al. |
| 2018/0047737 | A1 | 2/2018 | Chuang et al. |
| 2018/0233417 | A1 | 8/2018 | Pranatharthiharan et al. |
| 2018/0012887 | A1 | 11/2018 | Labonte et al. |

OTHER PUBLICATIONS

Kangguo Cheng et al., "Semiconductor Device With Local Connection," U.S. Appl. No. 16/042,561, filed Jul. 23, 2018.
Kangguo Cheng et al., "Semiconductor Device With Local Connection," U.S. Appl. No. 16/042,585, filed Jul. 23, 2018.
List of IBM Patents or Patent Applications Treated As Related; (Appendix P); Date Filed: Aug. 16, 2019, 2 pages.

* cited by examiner

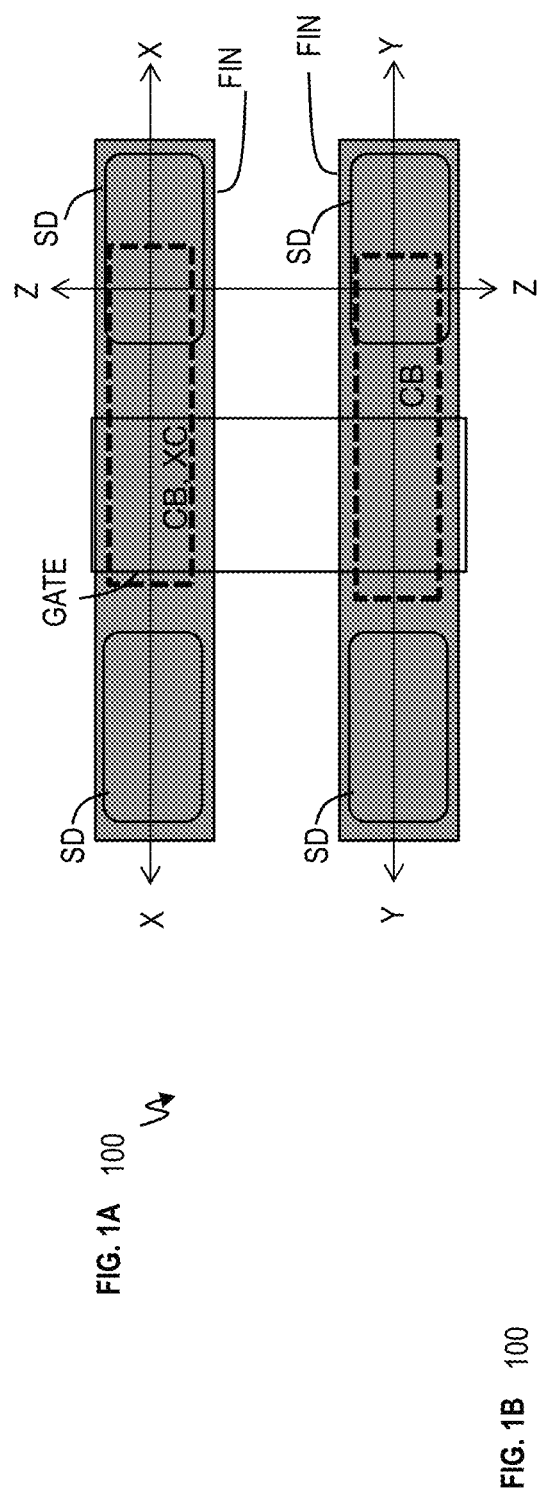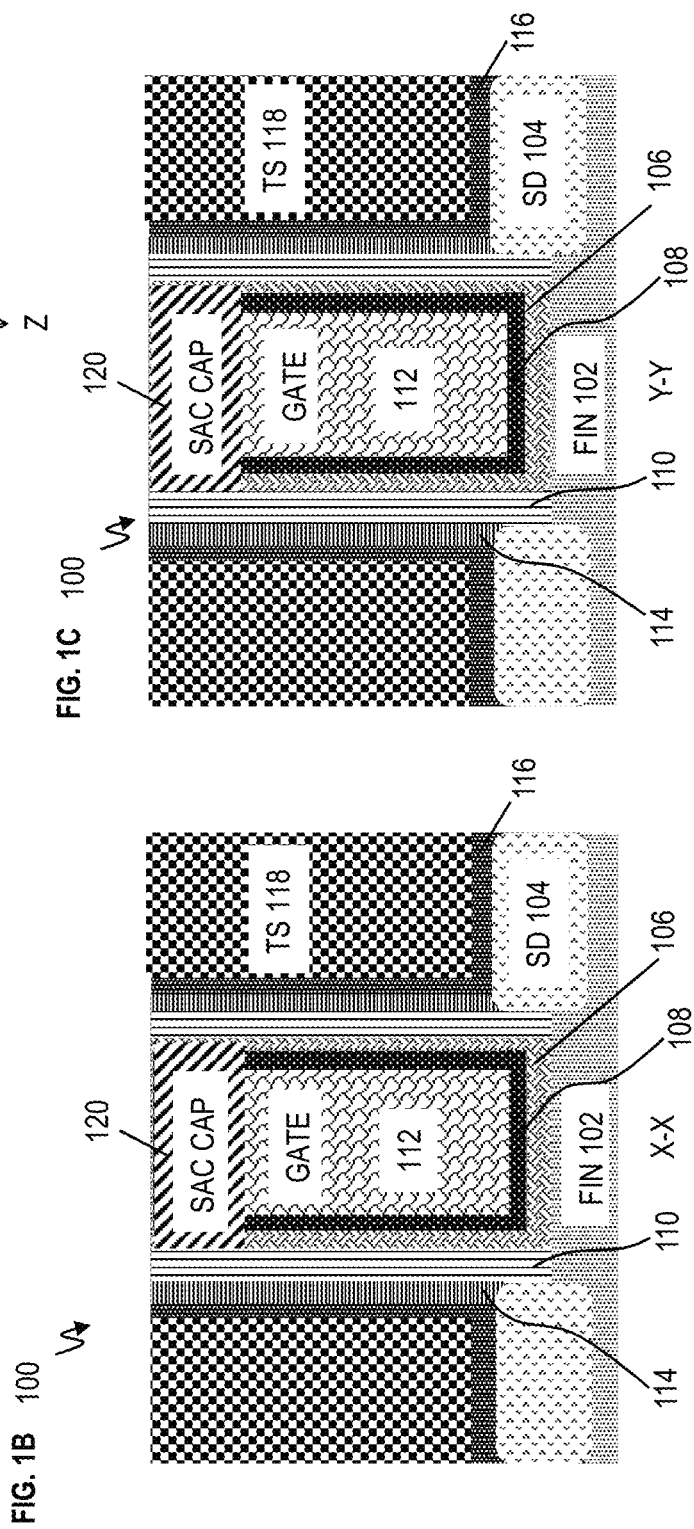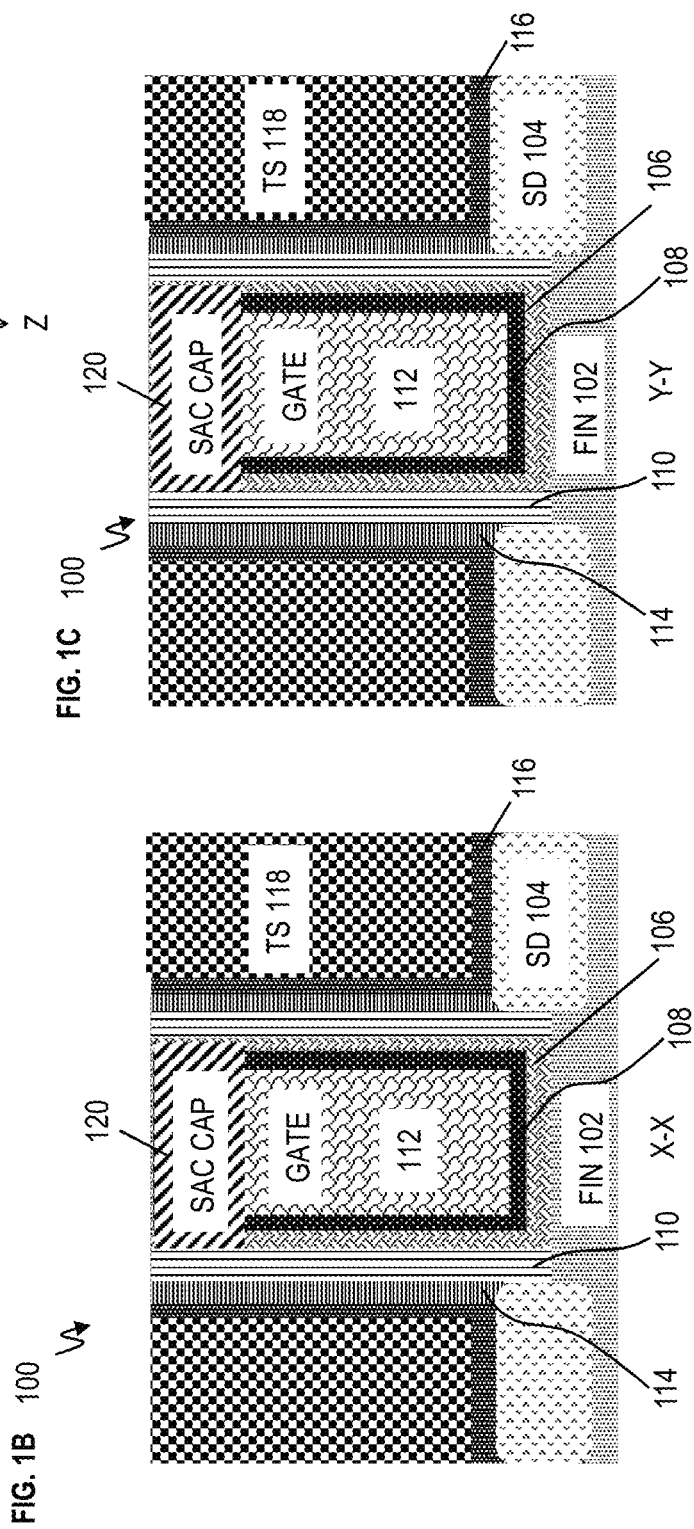

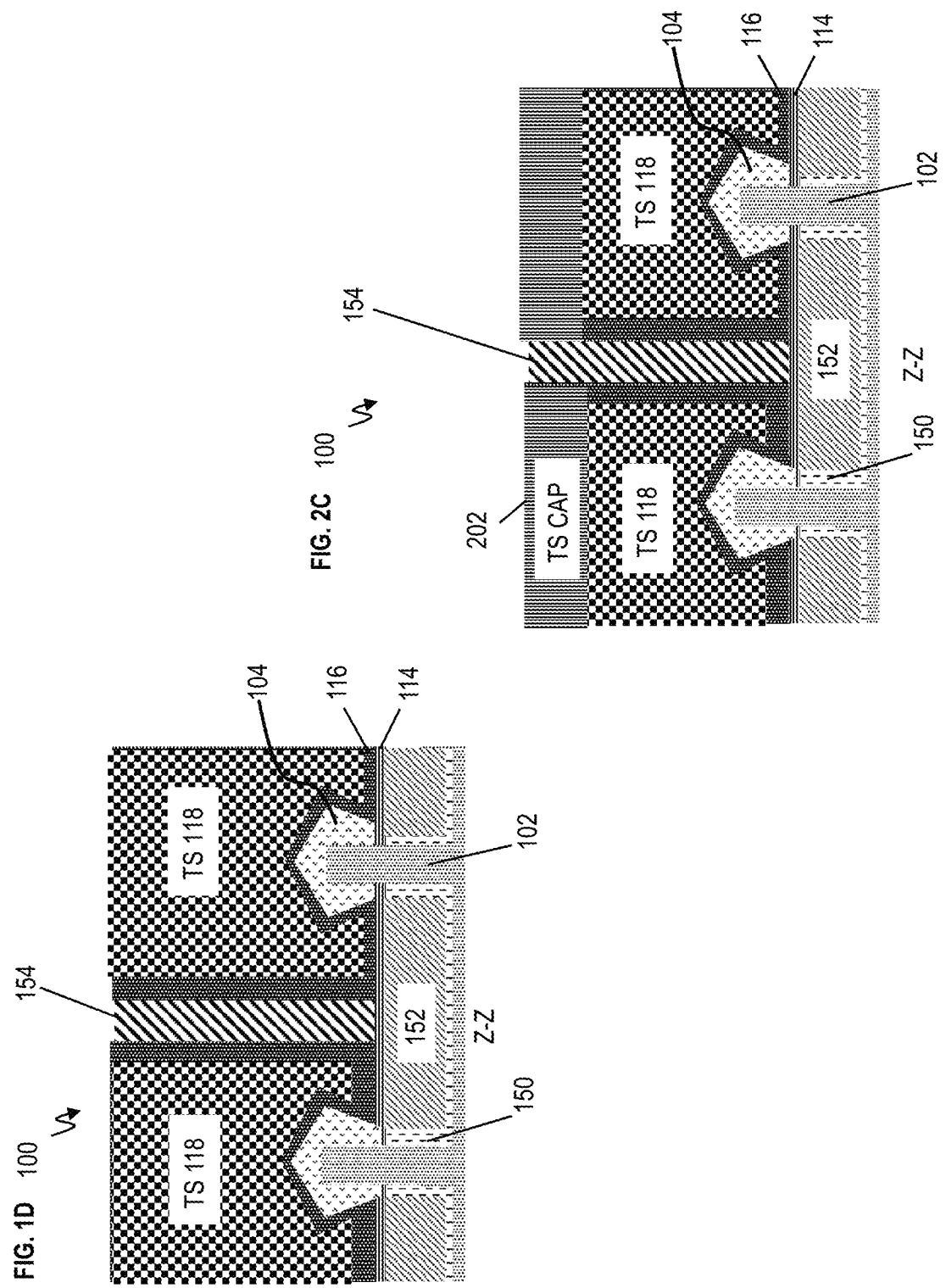

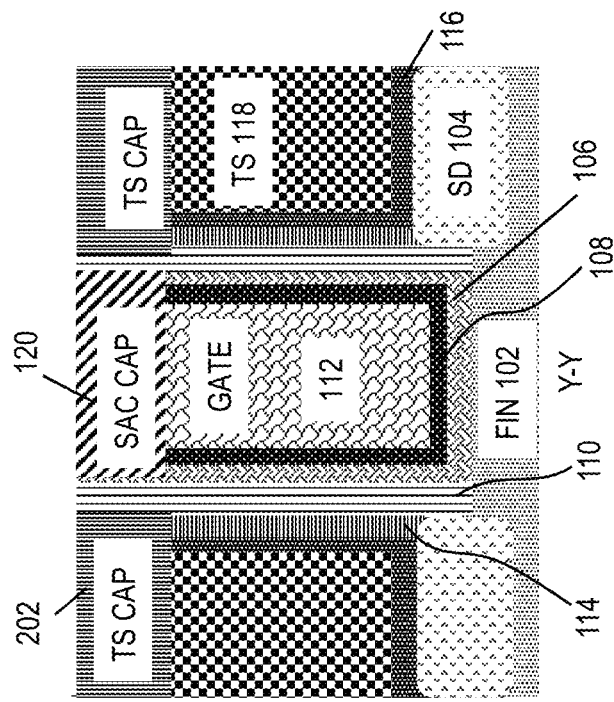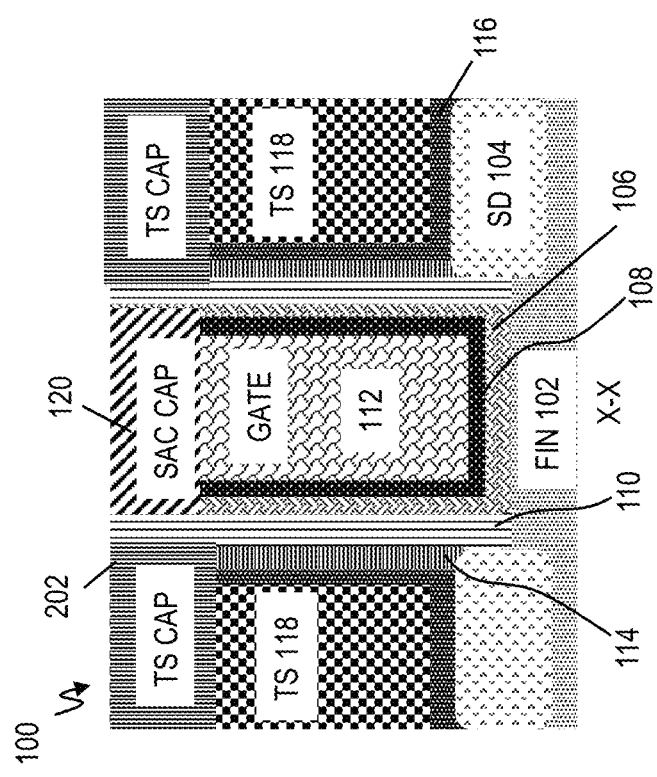

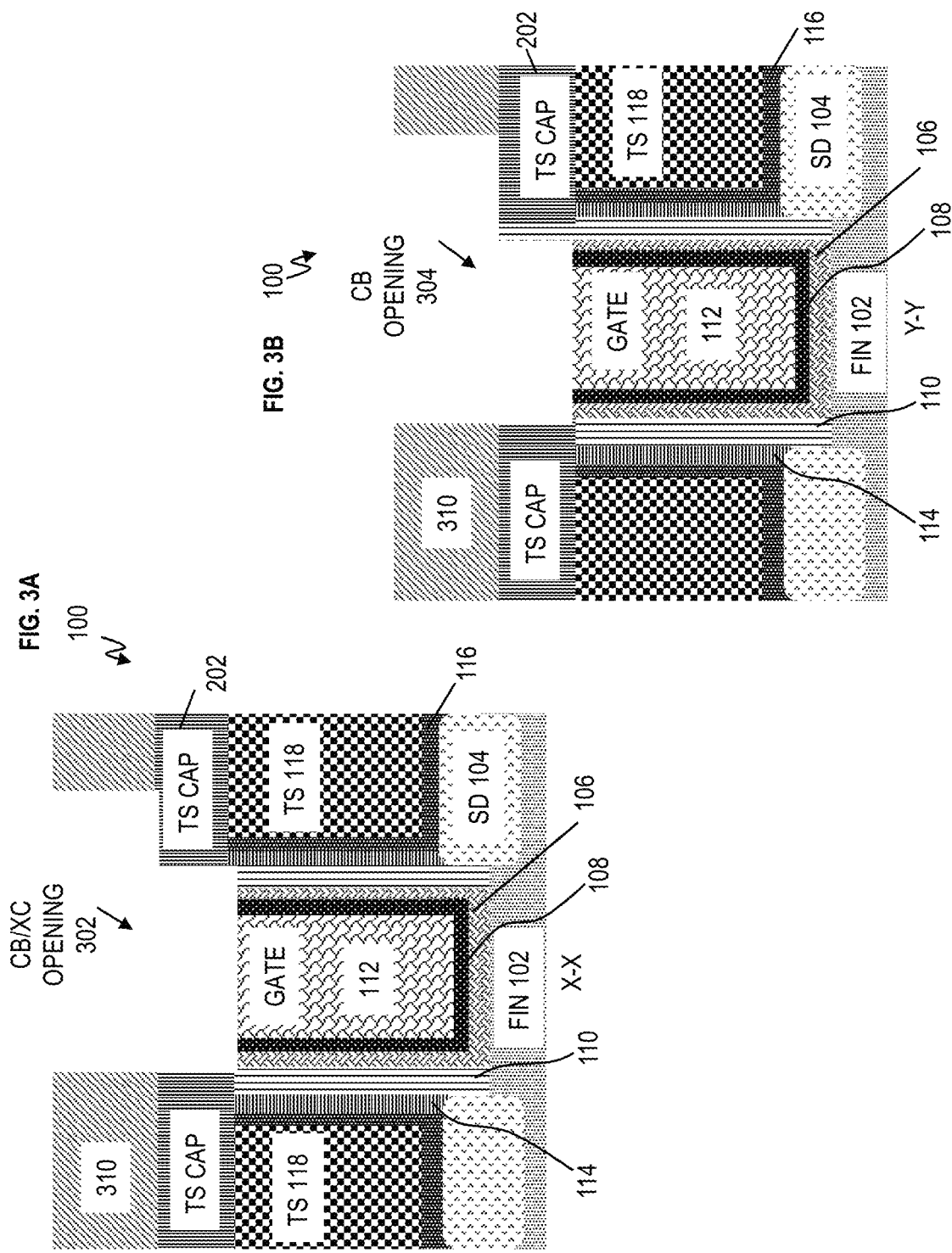

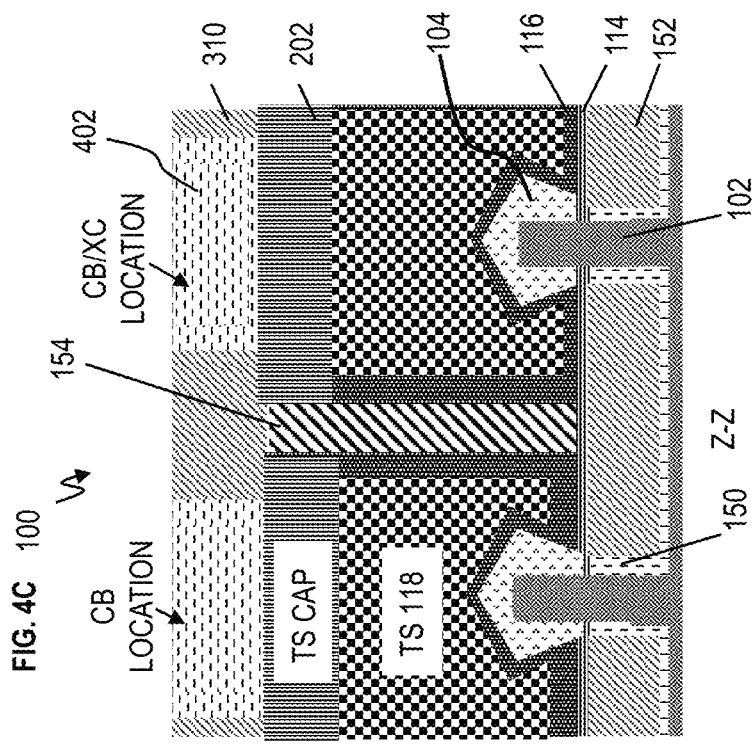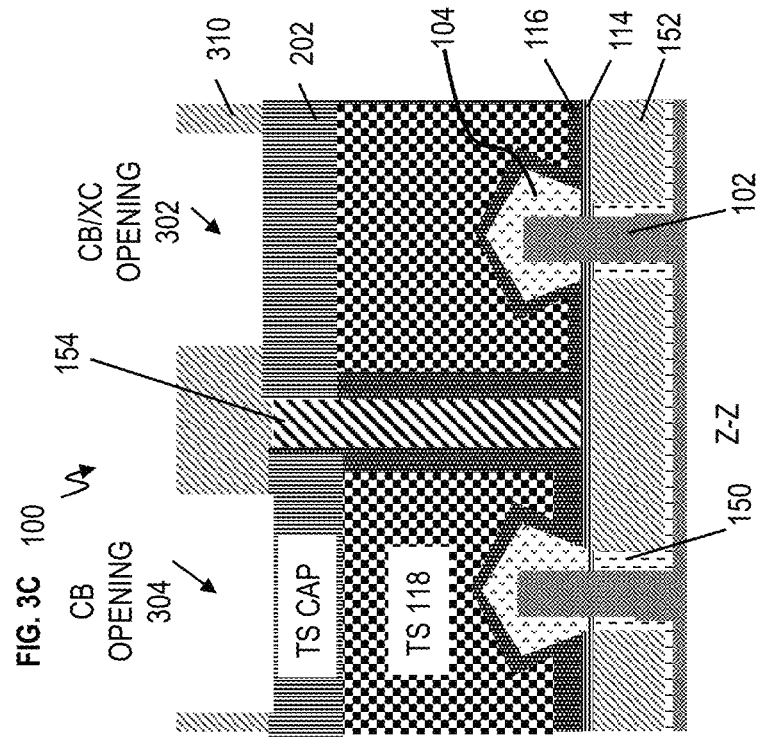

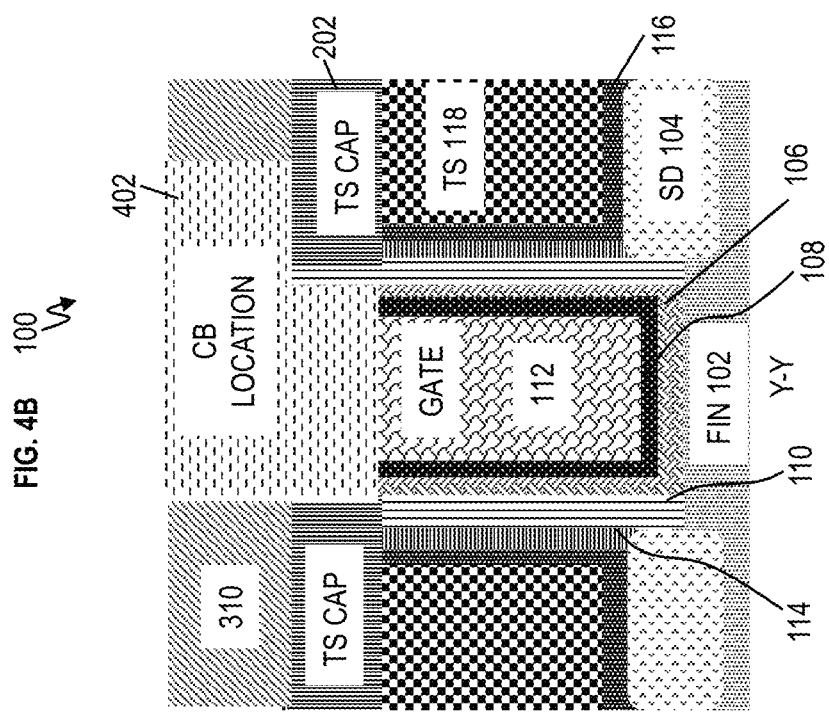
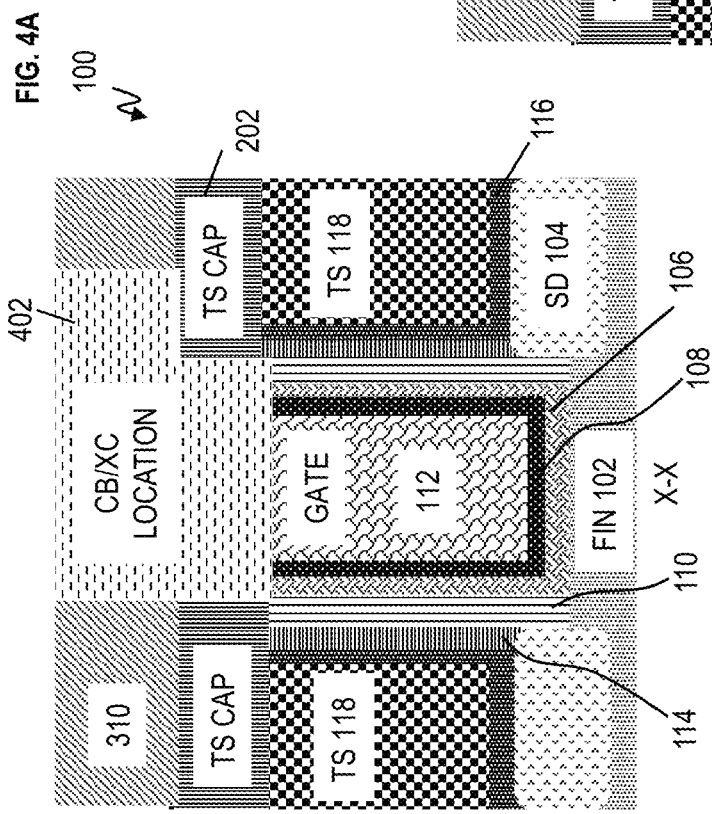

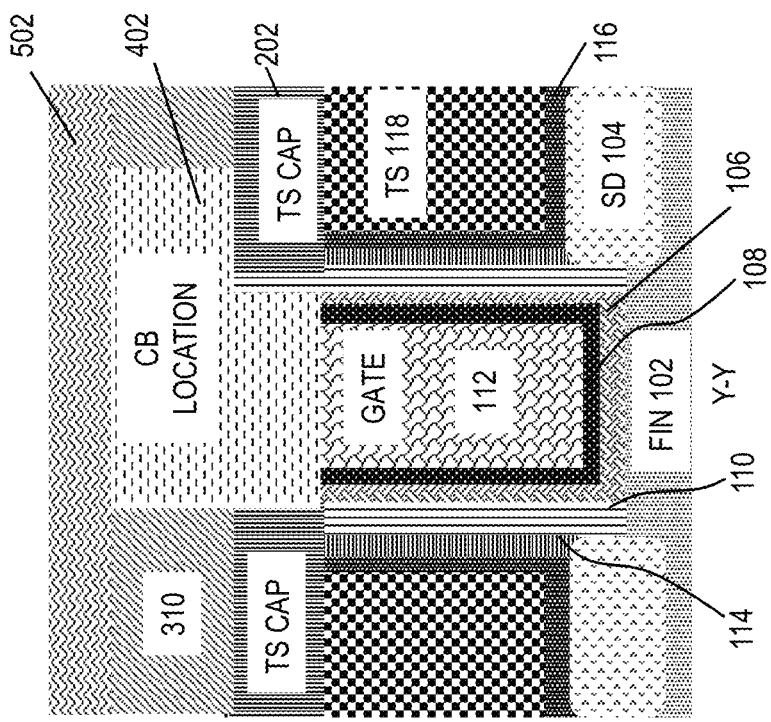
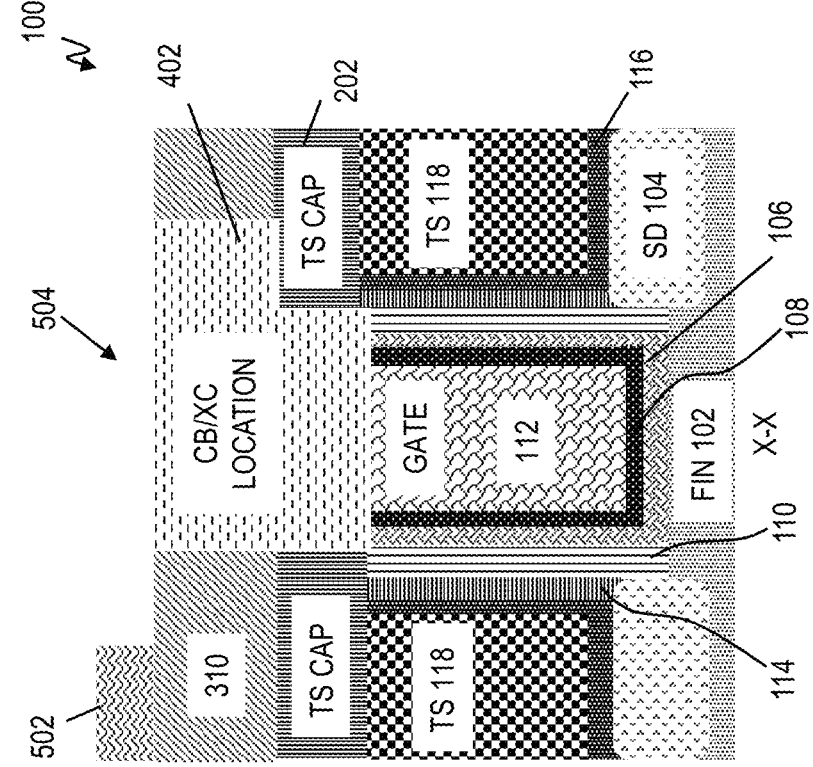

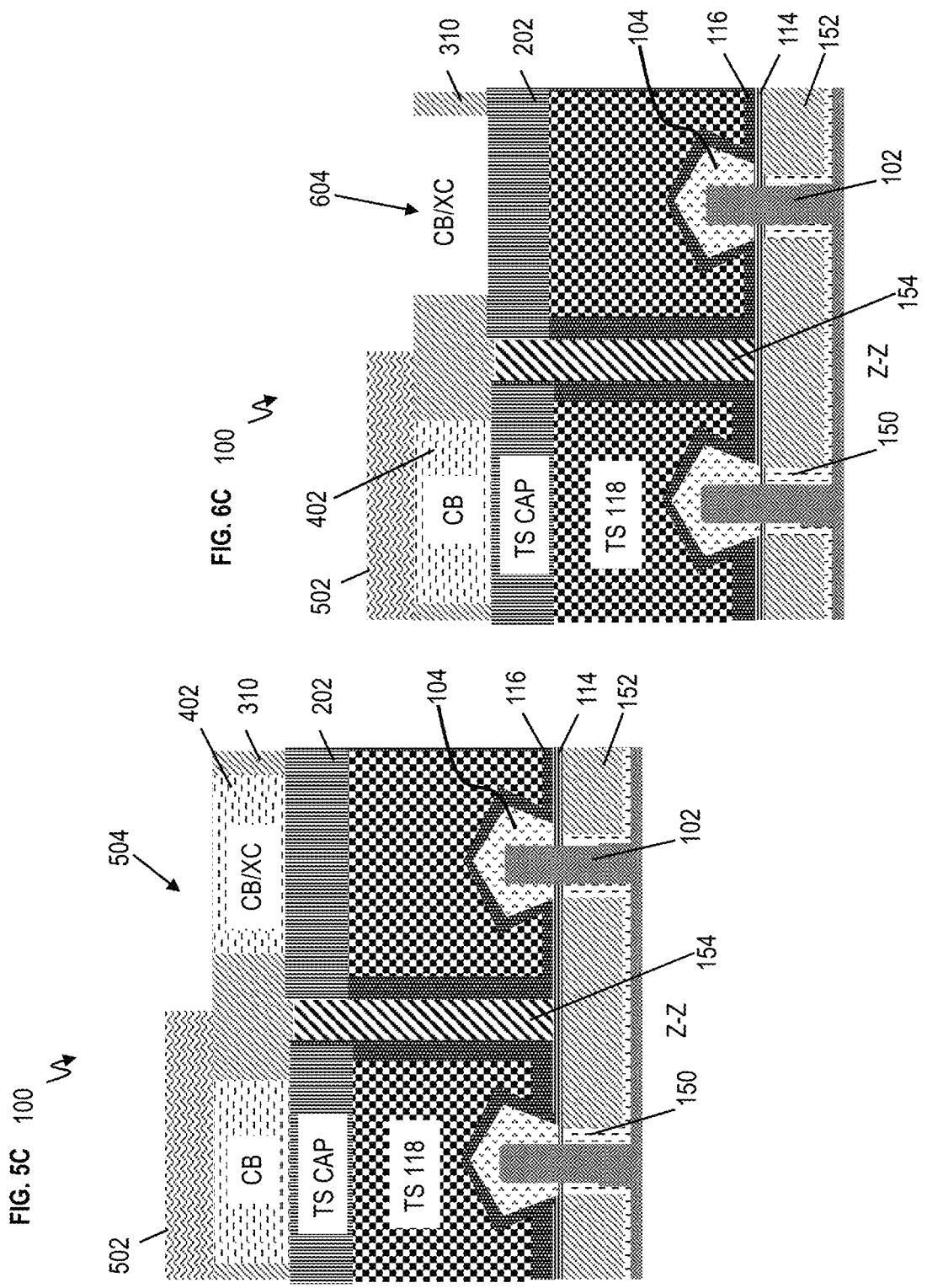

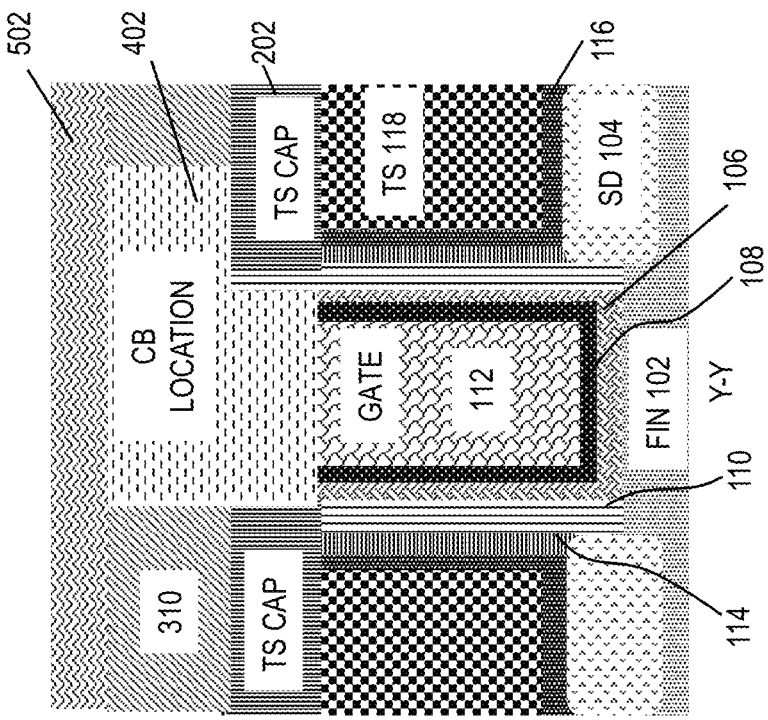
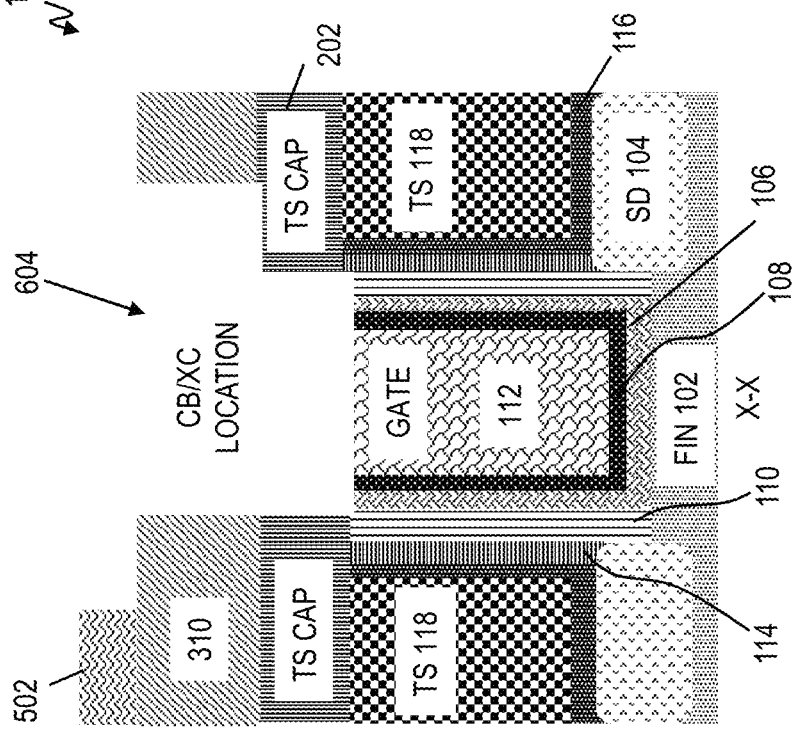

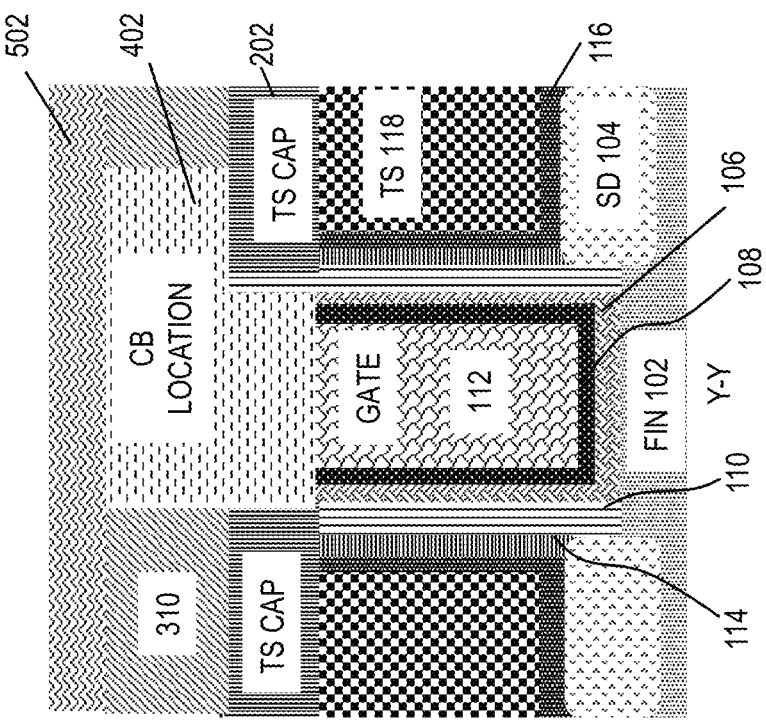
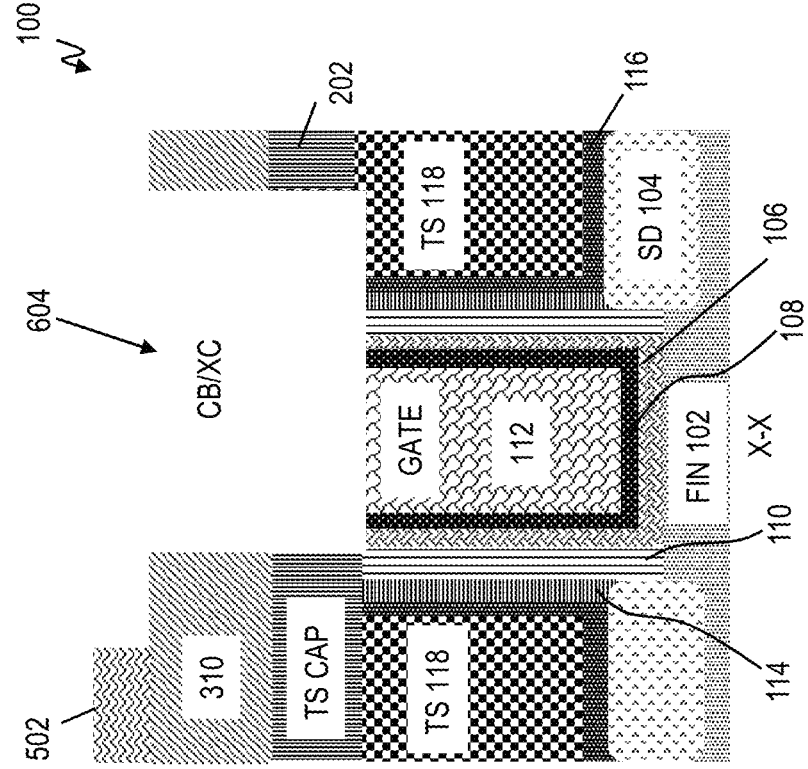

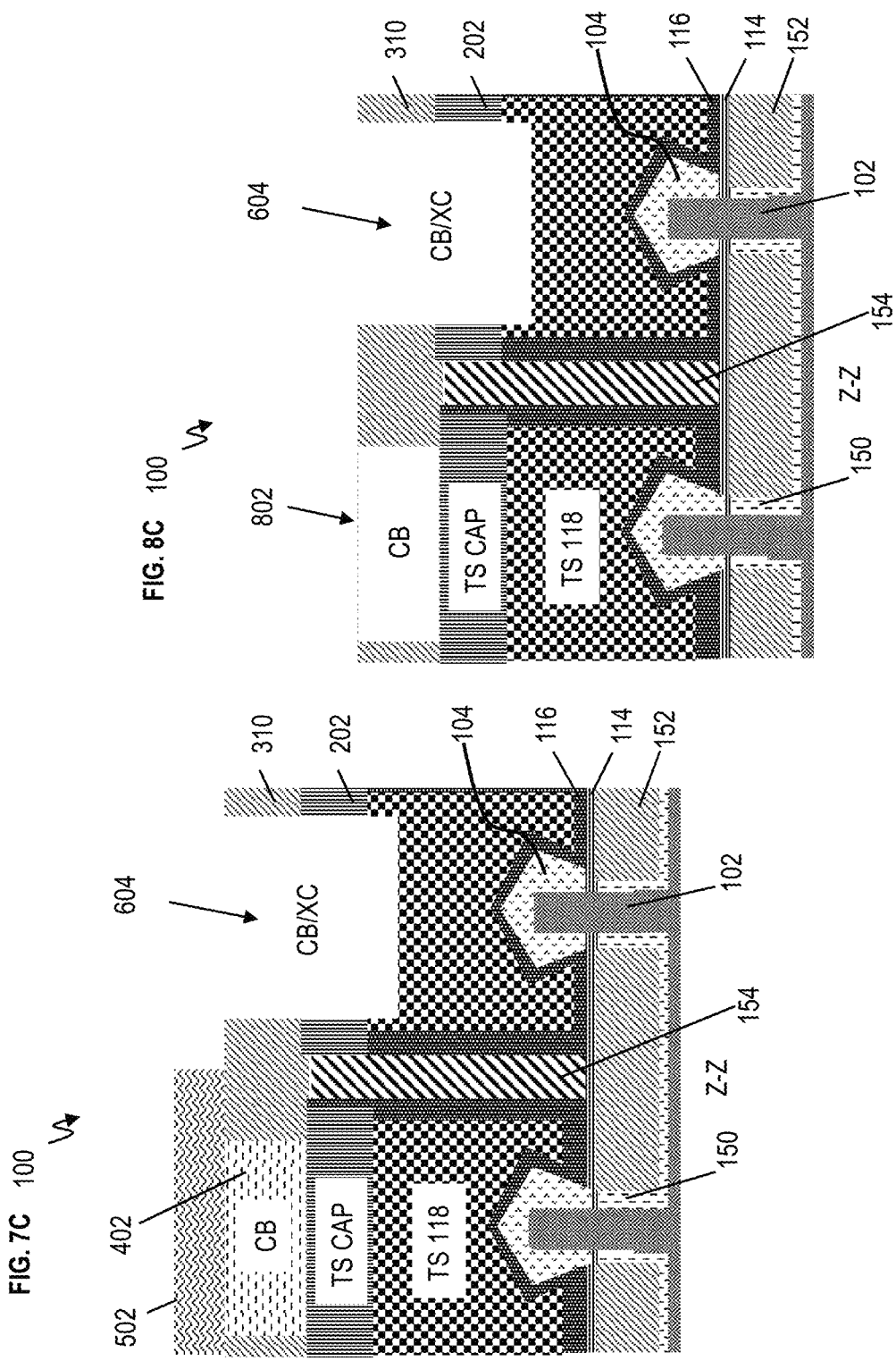

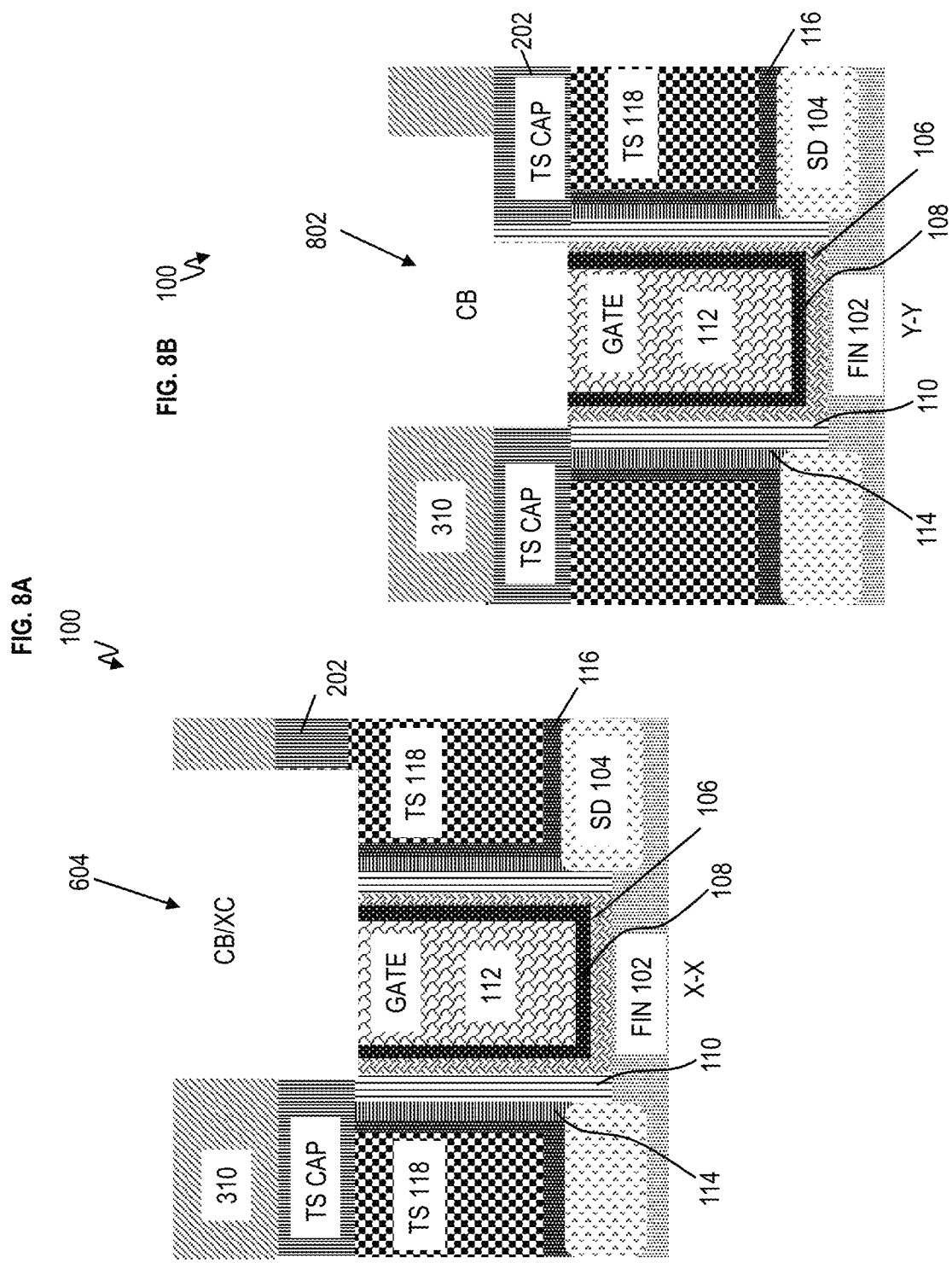

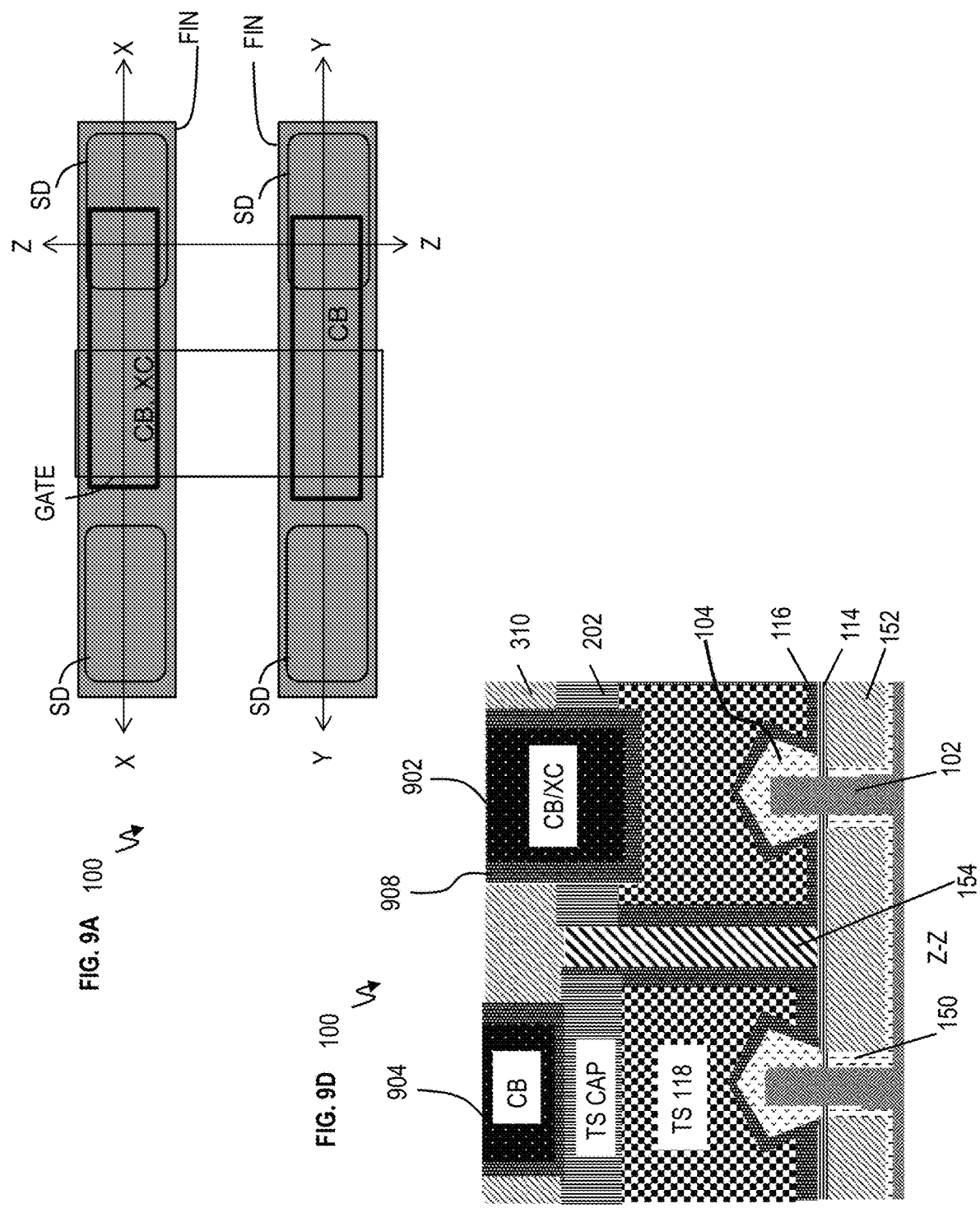

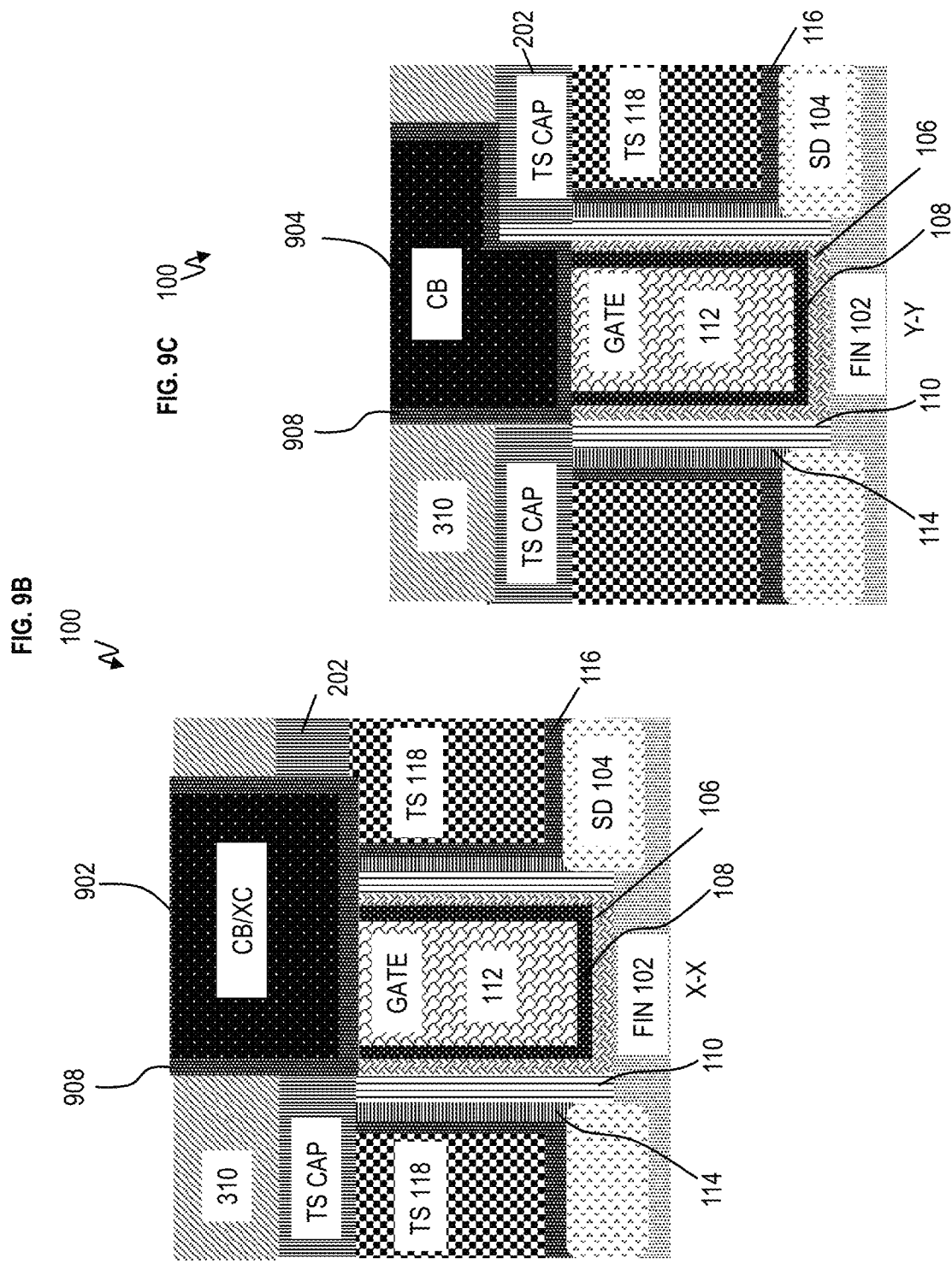

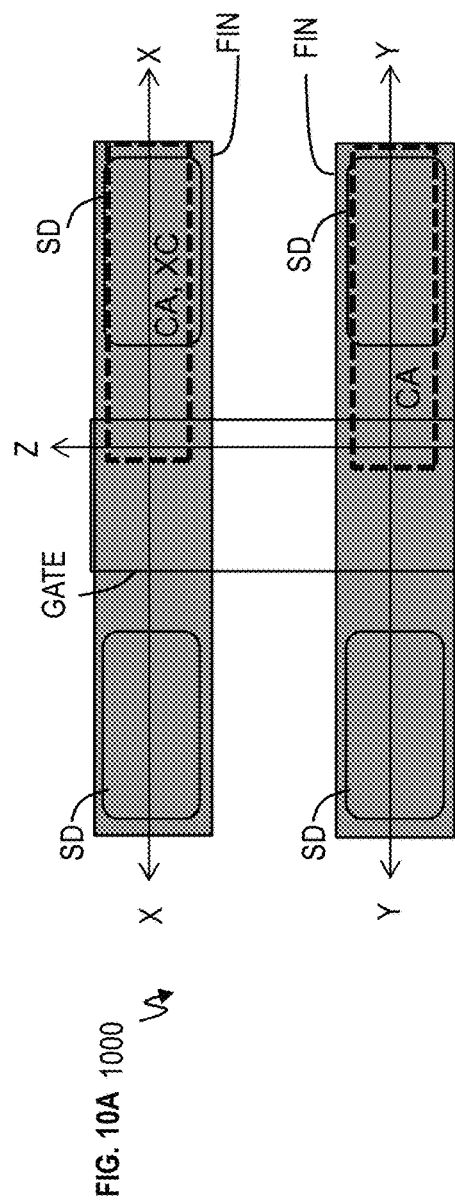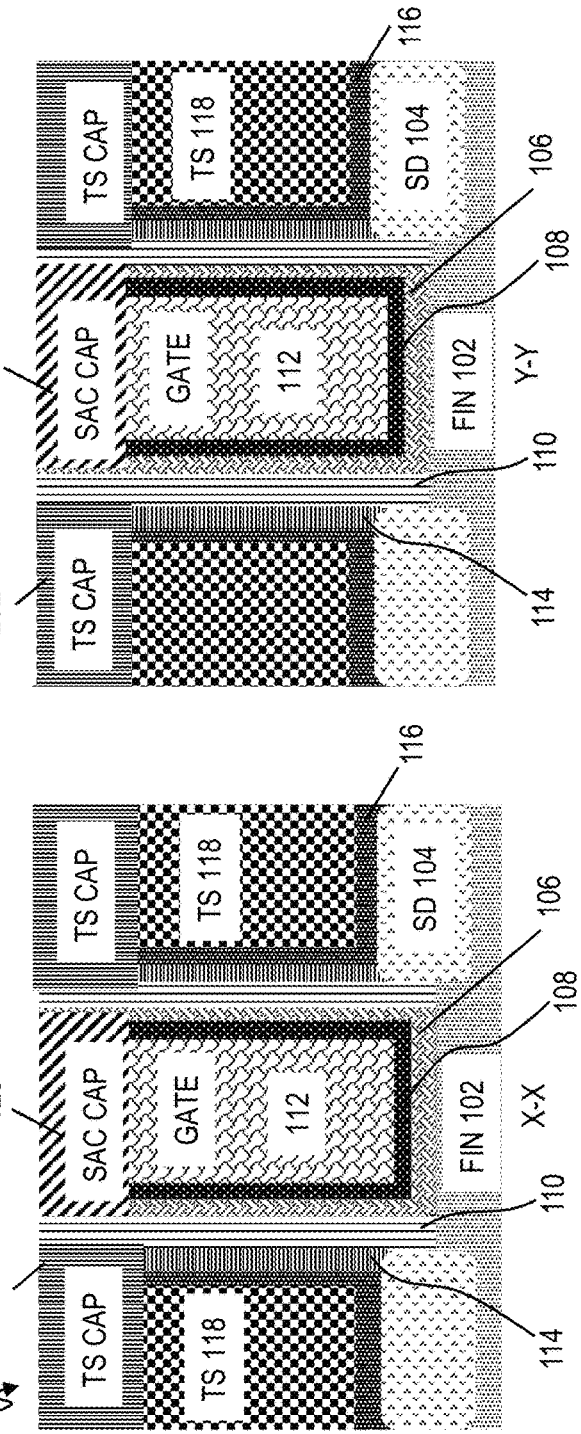

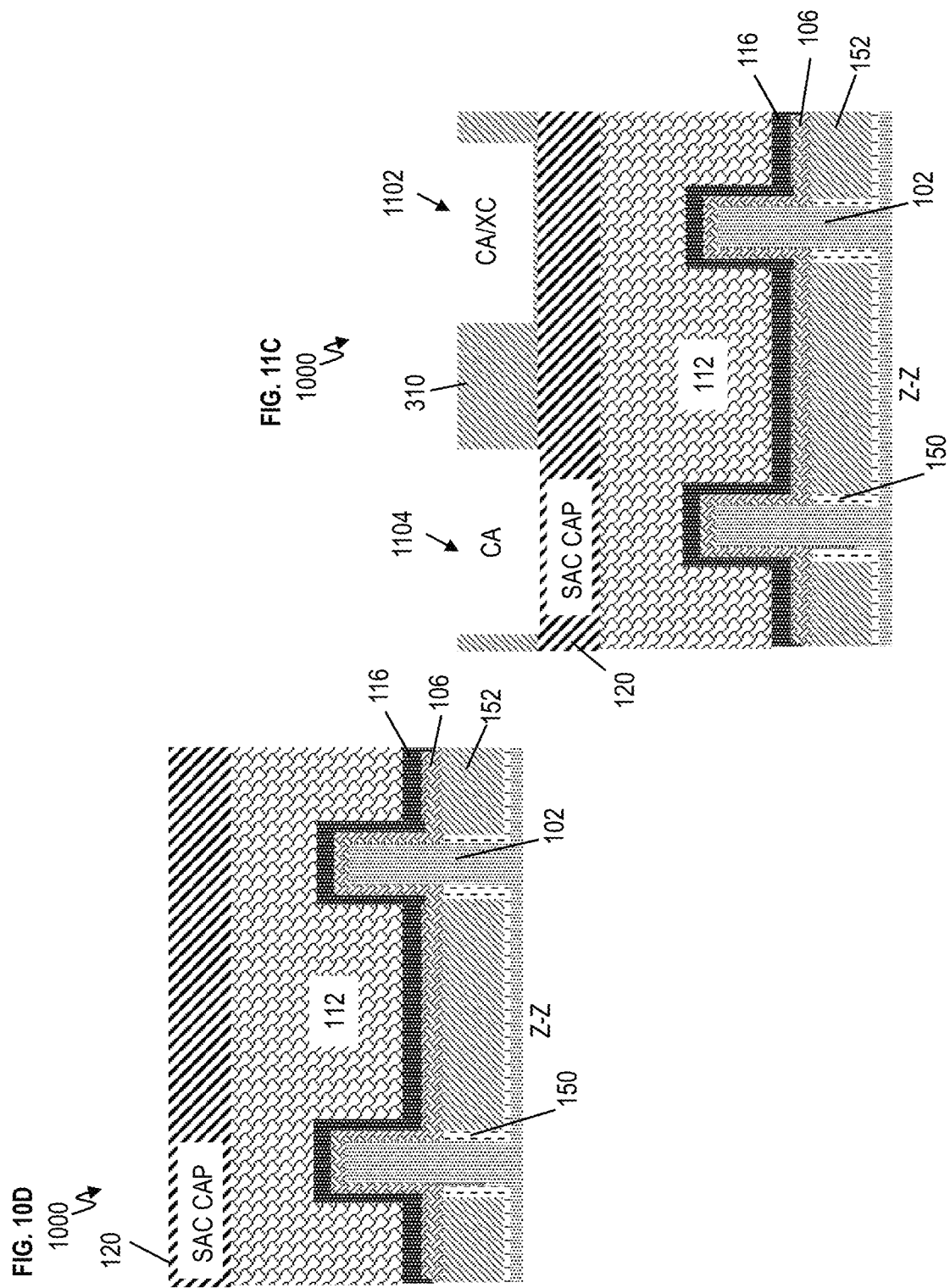

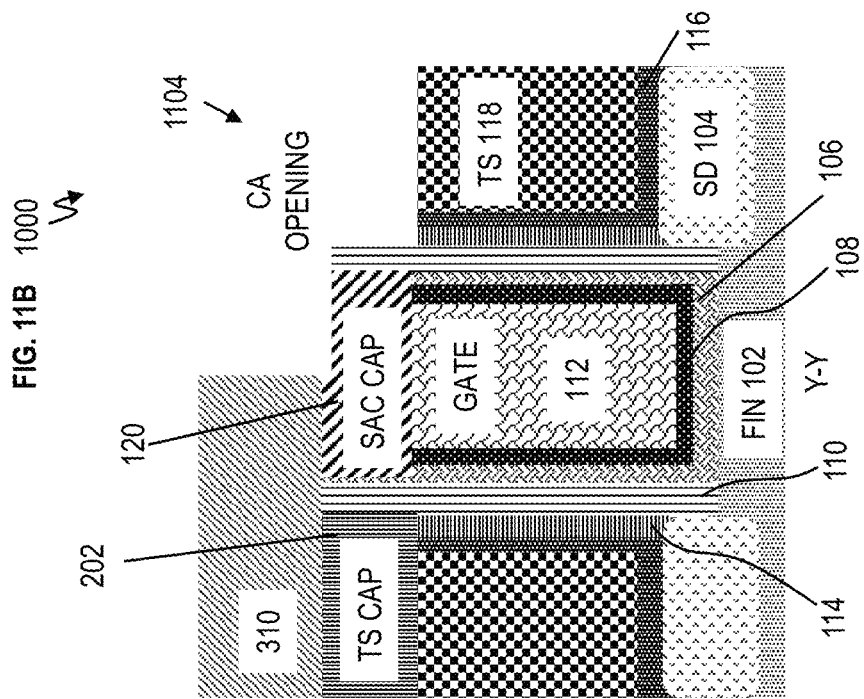
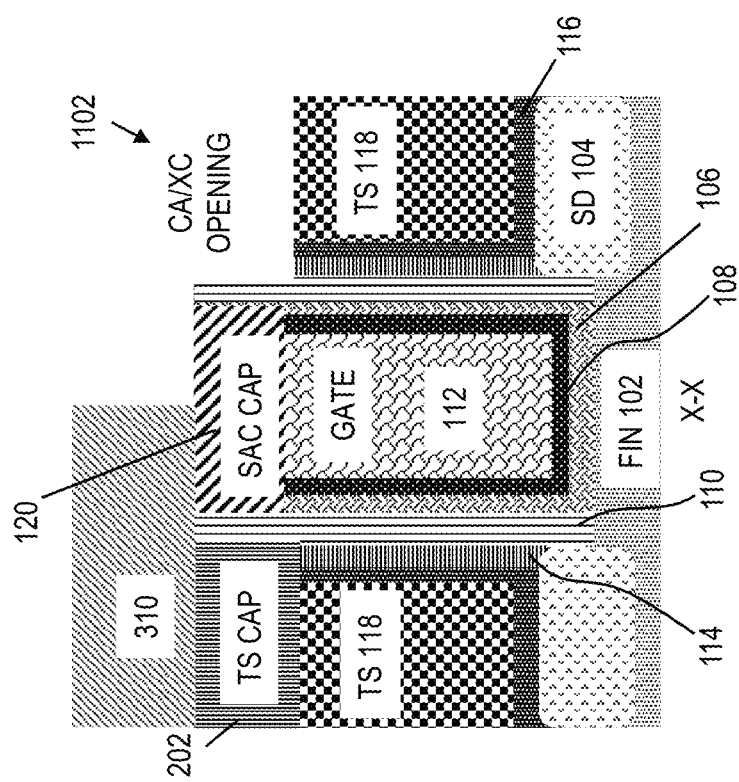

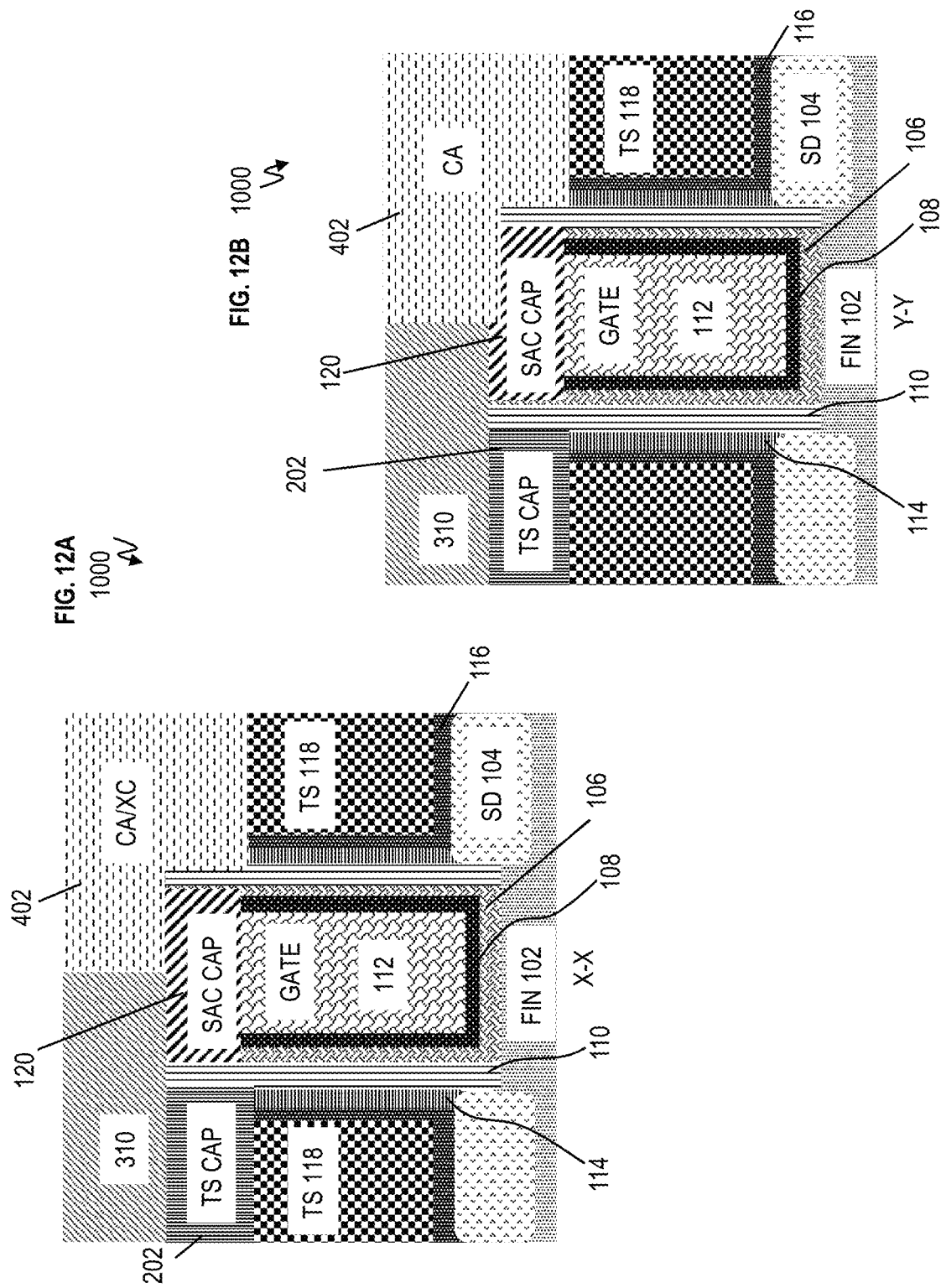

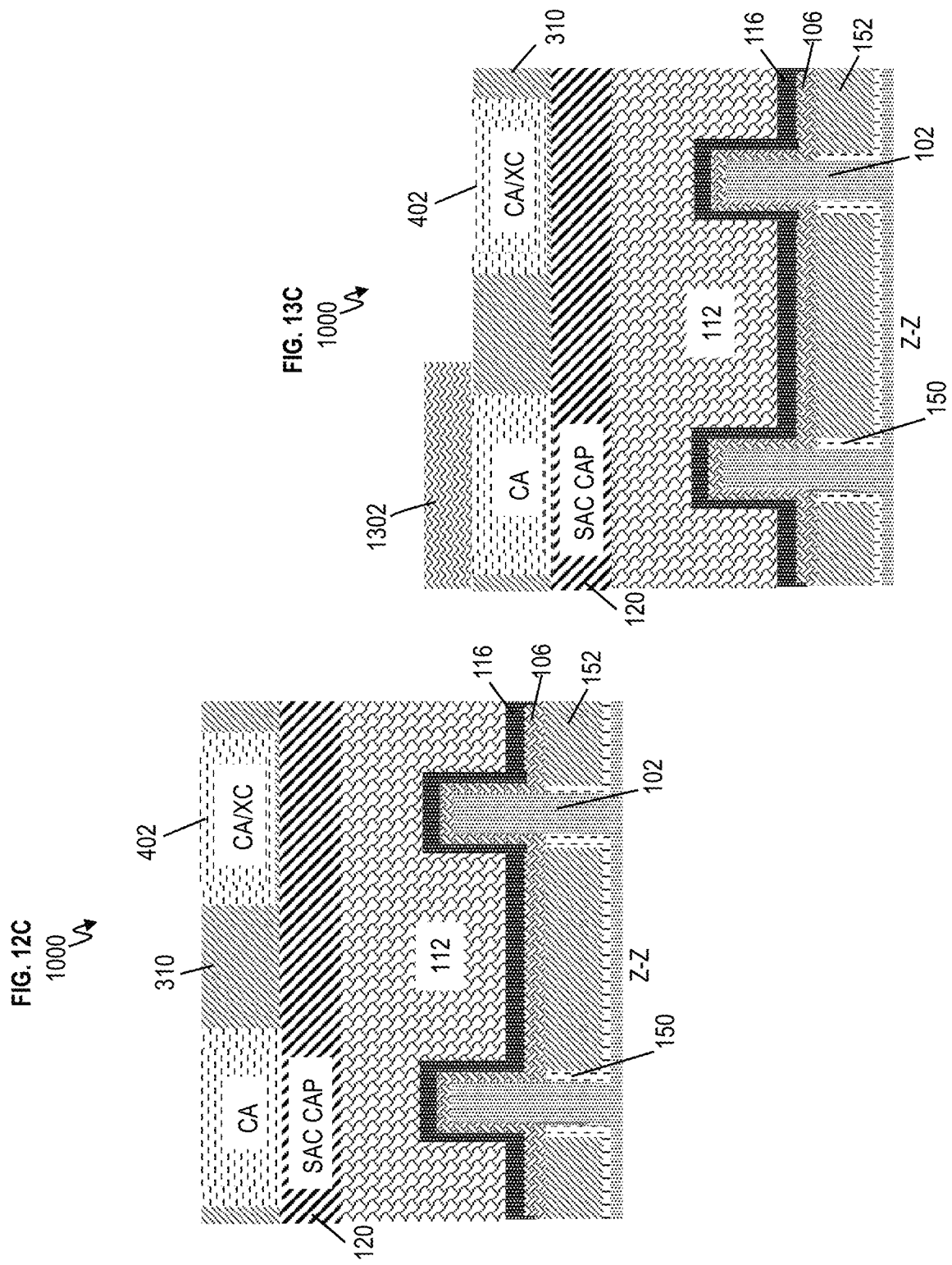

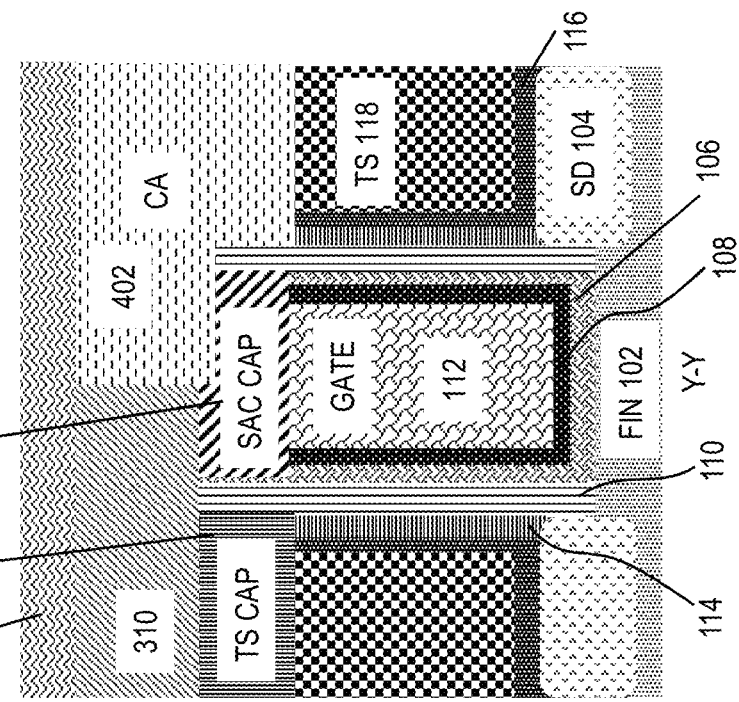
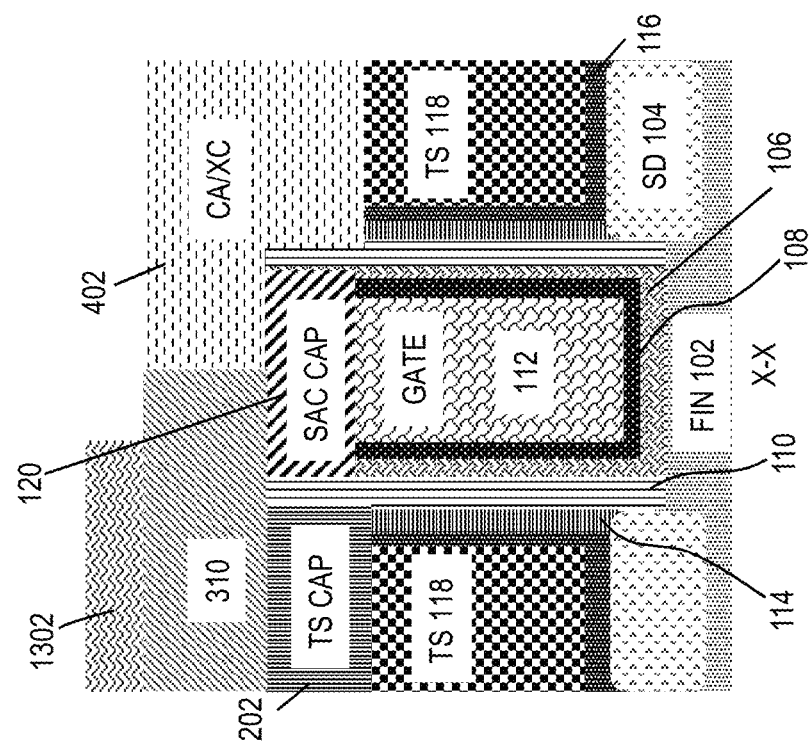

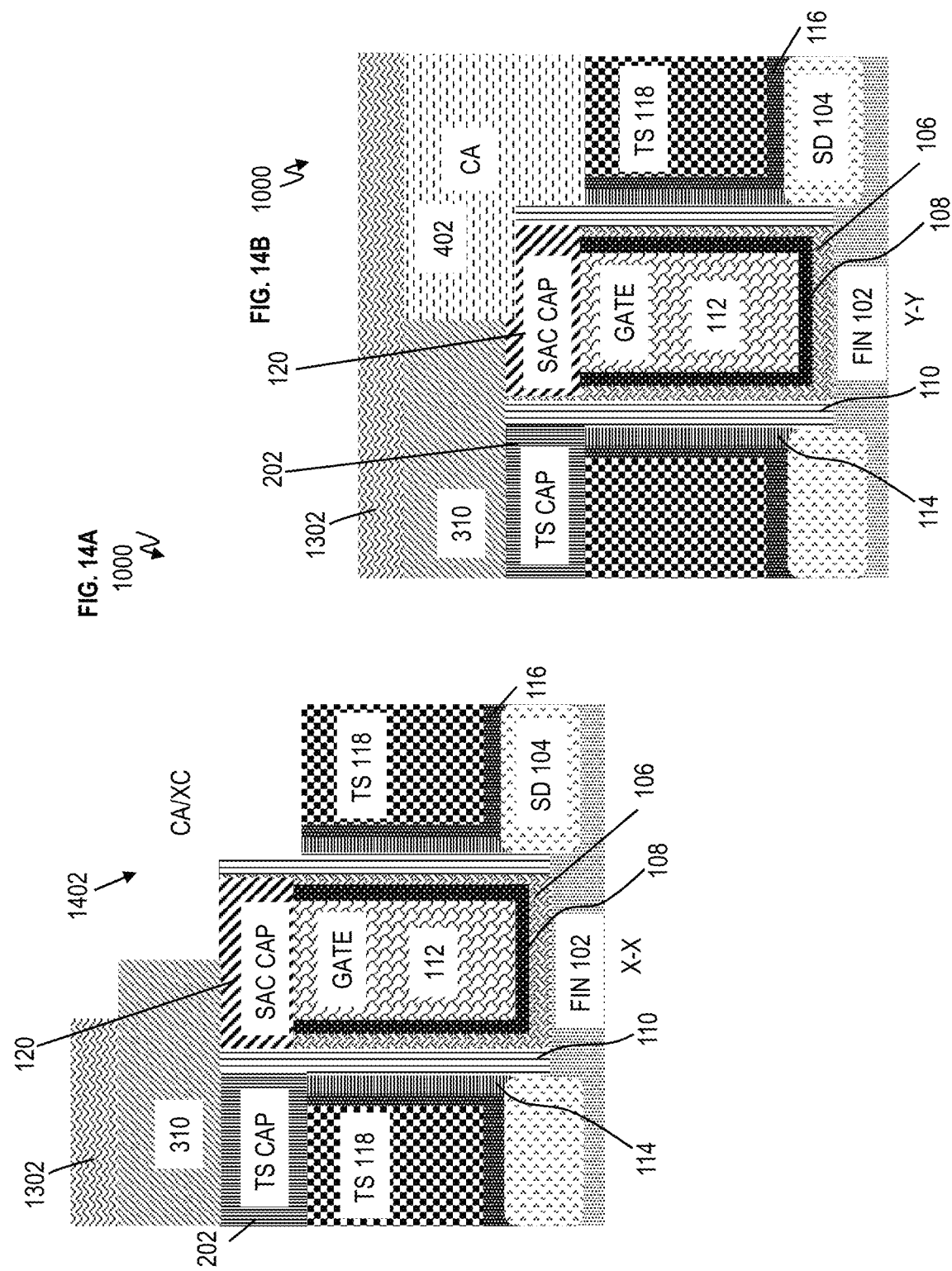

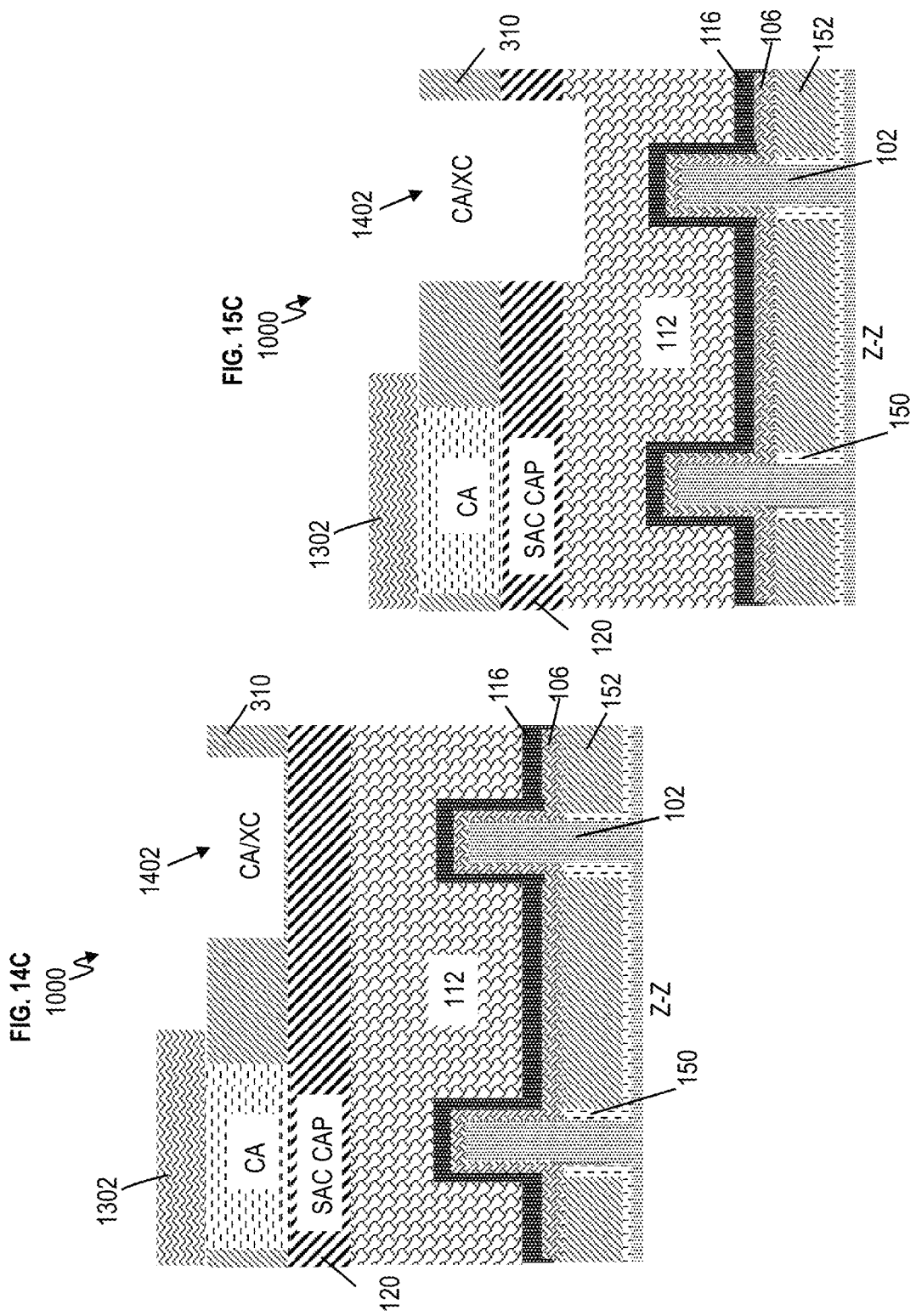

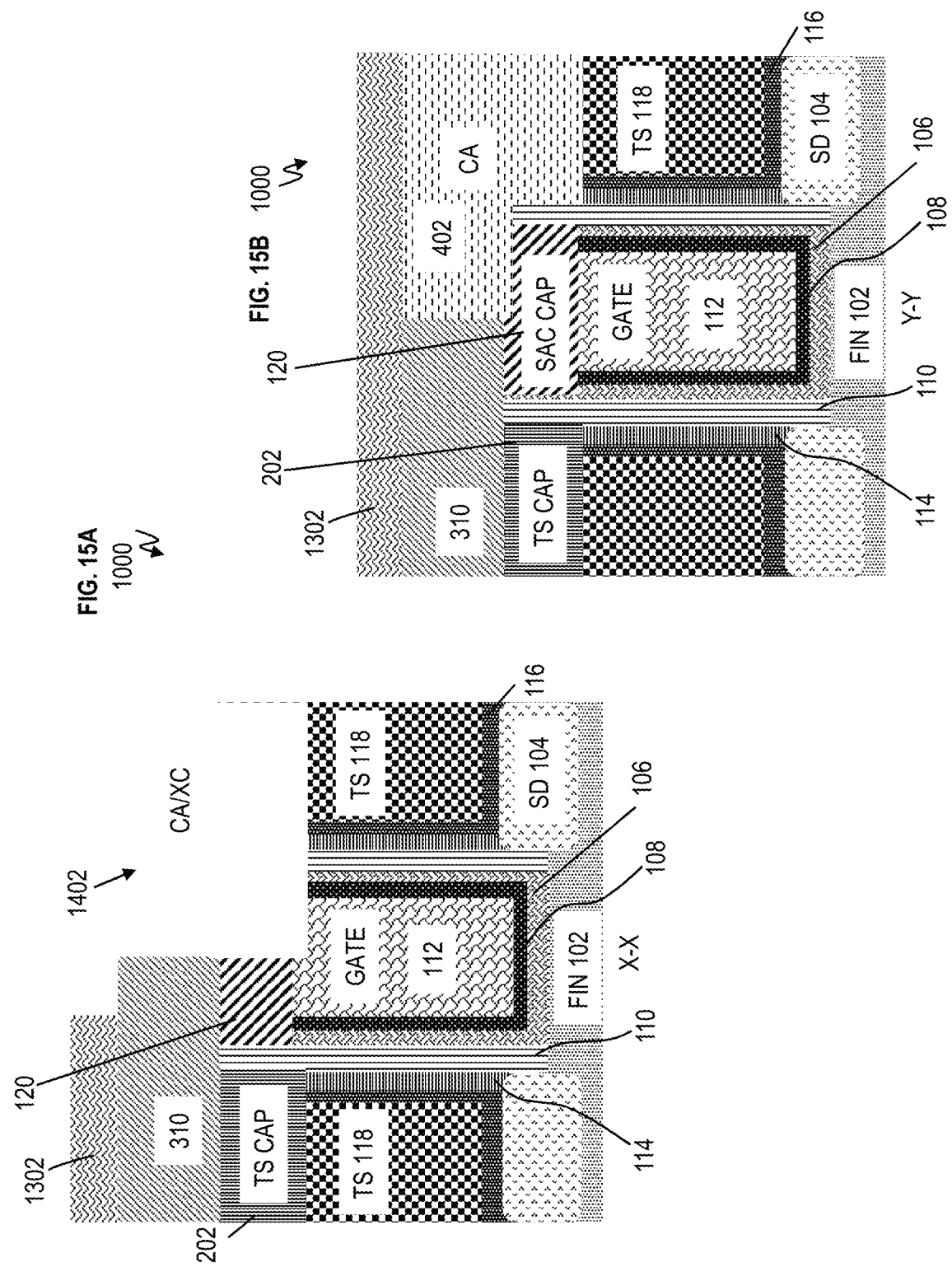

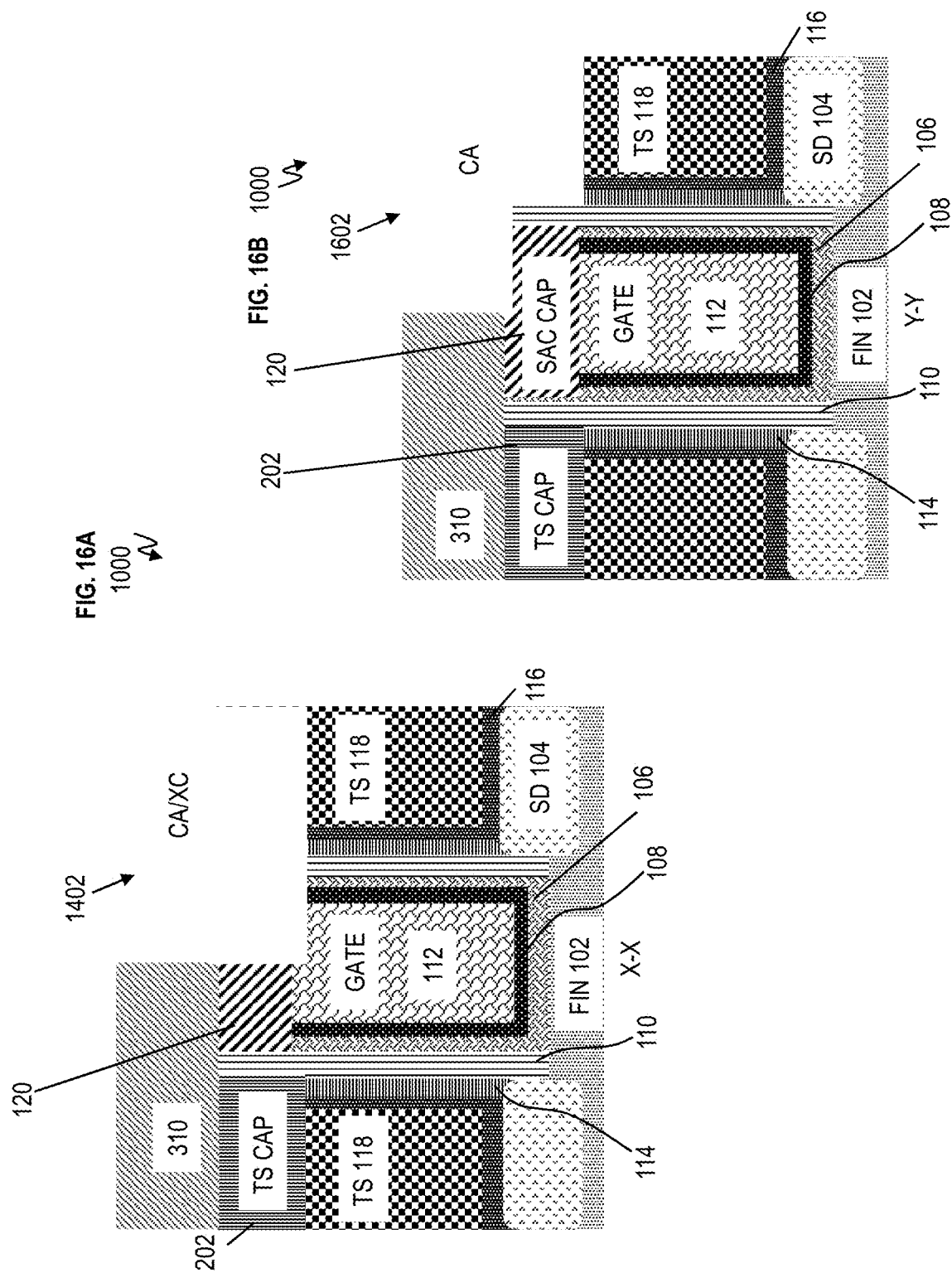

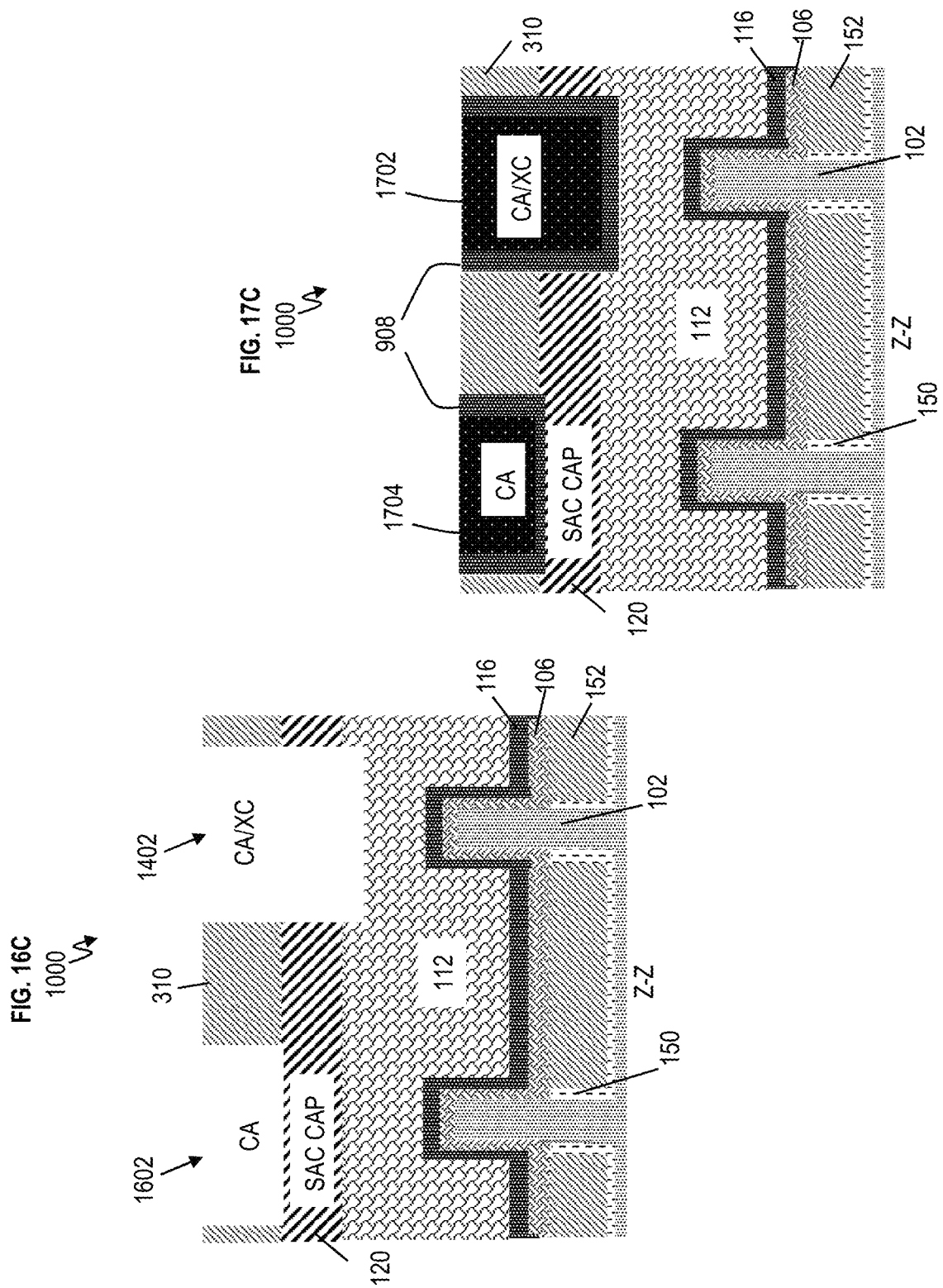

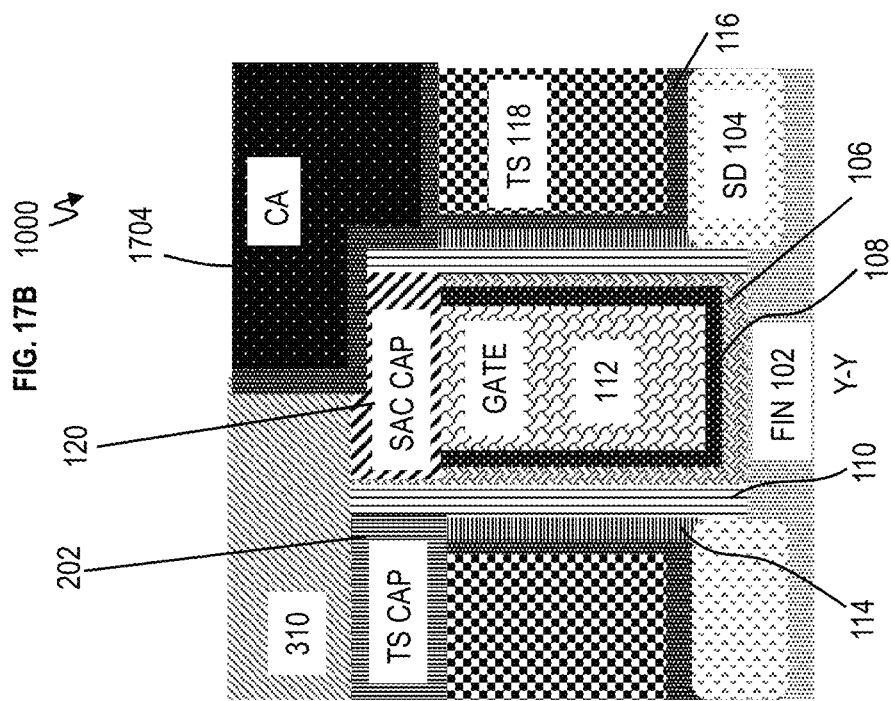
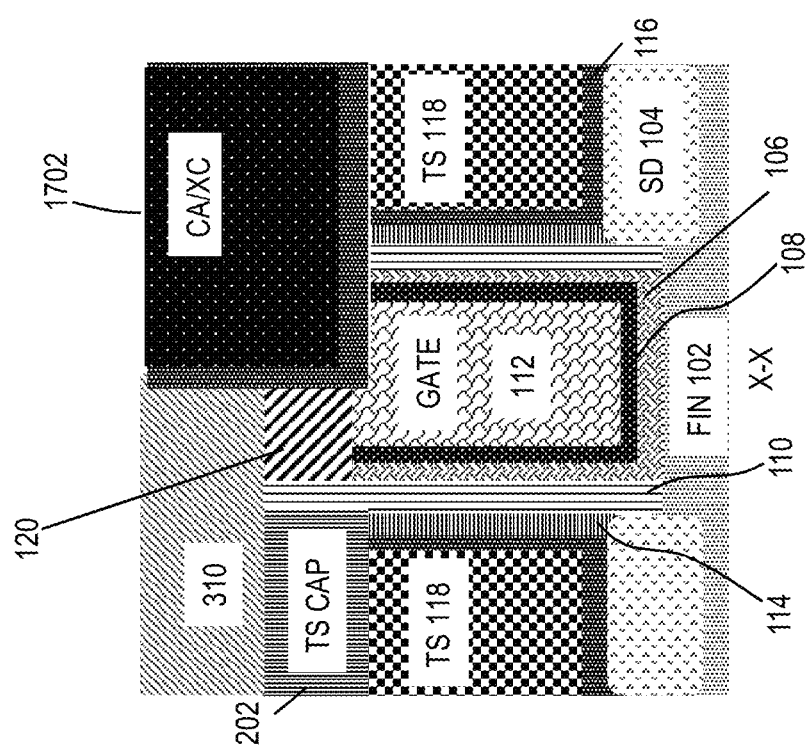

US 10,985,063 B2

SEMICONDUCTOR DEVICE WITH LOCAL CONNECTION

DOMESTIC PRIORITY

This application is a continuation of U.S. patent application Ser. No. 16/042,585, filed Jul. 23, 2018, the disclosure of which is incorporated by reference herein in its entirety.

BACKGROUND

The present invention generally relates to fabrication methods and resulting structures for semiconductor devices, and more specifically, to a semiconductor device with a local connection.

A metal-oxide-semiconductor field-effect transistors (MOSFET) is used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers.

SUMMARY

Embodiments of the invention are directed to a method for forming a semiconductor device. A non-limiting example of the method includes forming a first trench silicide (TS) coupled to a first source or drain (S/D) over a first fin, a second TS coupled to a second S/D over the first fin, a third TS coupled to a third S/D over a second fin, a fourth TS coupled to a fourth S/D over the second fin, a gate metal over the first and second fins, and a gate cap over the gate metal. The method includes forming a first TS cap on the first TS, a second TS cap on the second TS, a third TS cap on the third TS, and fourth TS cap on the fourth TS. The method includes forming an inter-level dielectric (ILD) on top of the gate cap and the first, second, third and fourth TS caps and forming a first opening through the ILD and the second TS cap such that part of the gate metal is exposed, after removing part of the gate cap. Also, the method includes forming a second opening through the ILD to expose another part of the gate metal, and forming a combined gate metal contact and local metal connection in the first opening and individual gate metal contact in the second opening.

Embodiments of the invention are directed to a semiconductor device. A non-limiting example of the semiconductor device includes a first trench silicide (TS) coupled to a first source or drain (S/D) over a first fin, a second TS coupled to a second S/D on the first fin, a third TS coupled to a third S/D over a second fin, a fourth TS coupled to a fourth S/D over the second fin, and a gate metal over the first and second fins. The device includes a first TS cap on the first TS, a second TS cap on the second TS, a third TS cap on the third TS, and fourth TS on the third S/D. Also, the device includes an inter-level dielectric (ILD) over the first, second, third and fourth TS caps, and a combined gate metal contact and local metal connection formed through the ILD and the second TS cap so as to be on part of the gate metal. The device includes an individual gate metal contact through the ILD to so as to be on another part of the gate metal.

Embodiments of the invention are directed to a method for forming a semiconductor device. A non-limiting example of the method includes forming a first trench silicide (TS) coupled to a first source or drain (S/D) over a first fin, a second TS coupled to a second S/D over the first fin, a third TS coupled to a third S/D over a second fin, a fourth TS coupled to a fourth S/D over the second fin, a gate metal over the first and second fins, and a gate cap over the gate metal. The method includes forming a first TS cap on the first TS, a second TS cap on the second TS, a third TS cap on the third TS, and fourth TS cap on the fourth TS. The method includes forming an inter-level dielectric (ILD) on top of the gate cap and the first, second, third and fourth TS caps. Also, the method includes forming a first opening through the ILD, the gate cap, and the second TS cap such that part of the gate metal and the second TS are exposed and forming a second opening through the ILD and the fourth TS cap to expose the fourth TS. Also, the method includes forming a combined S/D metal contact and local metal connection in the first opening and an individual S/D metal contact in the second opening.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a simple diagram of a top view of a semiconductor device after an initial set of fabrication operations according to embodiments of the invention;

FIG. 1B depicts a cross-sectional view of the semiconductor device taken along line X-X in FIG. 1A according to embodiments of the invention;

FIG. 1C depicts a cross-sectional view of the semiconductor device taken along line Y-Y in FIG. 1A according to embodiments of the invention;

FIG. 1D depicts a cross-sectional view of the semiconductor device taken along line Z-Z in FIG. 1A according to embodiments of the invention;

FIG. 2A depicts a cross-sectional view of the semiconductor device taken along line X-X in FIG. 1A after fabrication operations according to embodiments of the invention;

FIG. 2B depicts a cross-sectional view of the semiconductor device taken along line Y-Y in FIG. 1A after fabrication operations according to embodiments of the invention;

FIG. 2C depicts a cross-sectional view of the semiconductor device taken along line Y-Y in FIG. 1A after fabrication operations according to embodiments of the invention;

FIG. 3A depicts a cross-sectional view of the semiconductor device taken along line X-X in FIG. 1A after fabrication operations according to embodiments of the invention;

FIG. 3B depicts a cross-sectional view of the semiconductor device taken along line Y-Y in FIG. 1A after fabrication operations according to embodiments of the invention;

FIG. 3C depicts a cross-sectional view of the semiconductor device taken along line Y-Y in FIG. 1A after fabrication operations according to embodiments of the invention;

FIG. 4A depicts a cross-sectional view of the semiconductor device taken along line X-X in FIG. 1A after fabrication operations according to embodiments of the invention;

FIG. 4B depicts a cross-sectional view of the semiconductor device taken along line Y-Y in FIG. 1A after fabrication operations according to embodiments of the invention;

FIG. 4C depicts a cross-sectional view of the semiconductor device taken along line Y-Y in FIG. 1A after fabrication operations according to embodiments of the invention;

FIG. 5A depicts a cross-sectional view of the semiconductor device taken along line X-X in FIG. 1A after fabrication operations according to embodiments of the invention;

FIG. 5B depicts a cross-sectional view of the semiconductor device taken along line Y-Y in FIG. 1A after fabrication operations according to embodiments of the invention;

FIG. 5C depicts a cross-sectional view of the semiconductor device taken along line Y-Y in FIG. 1A after fabrication operations according to embodiments of the invention;

FIG. 6A depicts a cross-sectional view of the semiconductor device taken along line X-X in FIG. 1A after fabrication operations according to embodiments of the invention;

FIG. 6B depicts a cross-sectional view of the semiconductor device taken along line Y-Y in FIG. 1A after fabrication operations according to embodiments of the invention;

FIG. 6C depicts a cross-sectional view of the semiconductor device taken along line Y-Y in FIG. 1A after fabrication operations according to embodiments of the invention;

FIG. 7A depicts a cross-sectional view of the semiconductor device taken along line X-X in FIG. 1A after fabrication operations according to embodiments of the invention;

FIG. 7B depicts a cross-sectional view of the semiconductor device taken along line Y-Y in FIG. 1A after fabrication operations according to embodiments of the invention;

FIG. 7C depicts a cross-sectional view of the semiconductor device taken along line Y-Y in FIG. 1A after fabrication operations according to embodiments of the invention;

FIG. 8A depicts a cross-sectional view of the semiconductor device taken along line X-X in FIG. 1A after fabrication operations according to embodiments of the invention;

FIG. 8B depicts a cross-sectional view of the semiconductor device taken along line Y-Y in FIG. 1A after fabrication operations according to embodiments of the invention;

FIG. 8C depicts a cross-sectional view of the semiconductor device taken along line Y-Y in FIG. 1A after fabrication operations according to embodiments of the invention;

FIG. 9A depicts a simple diagram of a top view of the semiconductor device after fabrication operations according to embodiments of the invention;

FIG. 9B depicts a cross-sectional view of the semiconductor device taken along line X-X in FIG. 9A according to embodiments of the invention;

FIG. 9C depicts a cross-sectional view of the semiconductor device taken along line Y-Y in FIG. 9A according to embodiments of the invention;

FIG. 9D depicts a cross-sectional view of the semiconductor device taken along line Z-Z in FIG. 9A according to embodiments of the invention;

FIG. 10A depicts a simple diagram of a top view of a semiconductor device after an initial set of fabrication operations according to embodiments of the invention;

FIG. 10B depicts a cross-sectional view of the semiconductor device taken along line X-X in FIG. 10A according to embodiments of the invention;

FIG. 10C depicts a cross-sectional view of the semiconductor device taken along line Y-Y in FIG. 10A according to embodiments of the invention;

FIG. 10D depicts a cross-sectional view of the semiconductor device taken along line Z-Z in FIG. 10A according to embodiments of the invention;

FIG. 11A depicts a cross-sectional view of the semiconductor device taken along line X-X in FIG. 10A after fabrication operations according to embodiments of the invention;

FIG. 11B depicts a cross-sectional view of the semiconductor device taken along line Y-Y in FIG. 10A after fabrication operations according to embodiments of the invention;

FIG. 11C depicts a cross-sectional view of the semiconductor device taken along line Y-Y in FIG. 10A after fabrication operations according to embodiments of the invention;

FIG. 12A depicts a cross-sectional view of the semiconductor device taken along line X-X in FIG. 10A after fabrication operations according to embodiments of the invention;

FIG. 12B depicts a cross-sectional view of the semiconductor device taken along line Y-Y in FIG. 10A after fabrication operations according to embodiments of the invention;

FIG. 12C depicts a cross-sectional view of the semiconductor device taken along line Y-Y in FIG. 10A after fabrication operations according to embodiments of the invention;

FIG. 13A depicts a cross-sectional view of the semiconductor device taken along line X-X in FIG. 10A after fabrication operations according to embodiments of the invention;

FIG. 13B depicts a cross-sectional view of the semiconductor device taken along line Y-Y in FIG. 10A after fabrication operations according to embodiments of the invention;

FIG. 13C depicts a cross-sectional view of the semiconductor device taken along line Y-Y in FIG. 10A after fabrication operations according to embodiments of the invention;

FIG. 14A depicts a cross-sectional view of the semiconductor device taken along line X-X in FIG. 10A after fabrication operations according to embodiments of the invention;

FIG. 14B depicts a cross-sectional view of the semiconductor device taken along line Y-Y in FIG. 10A after fabrication operations according to embodiments of the invention;

FIG. 14C depicts a cross-sectional view of the semiconductor device taken along line Y-Y in FIG. 10A after fabrication operations according to embodiments of the invention;

FIG. 15A depicts a cross-sectional view of the semiconductor device taken along line X-X in FIG. 10A after fabrication operations according to embodiments of the invention;

FIG. 15B depicts a cross-sectional view of the semiconductor device taken along line Y-Y in FIG. 10A after fabrication operations according to embodiments of the invention;

FIG. 15C depicts a cross-sectional view of the semiconductor device taken along line Y-Y in FIG. 10A after fabrication operations according to embodiments of the invention;

FIG. 16A depicts a cross-sectional view of the semiconductor device taken along line X-X in FIG. 10A after fabrication operations according to embodiments of the invention;

FIG. 16B depicts a cross-sectional view of the semiconductor device taken along line Y-Y in FIG. 10A after fabrication operations according to embodiments of the invention;

FIG. 16C depicts a cross-sectional view of the semiconductor device taken along line Y-Y in FIG. 10A after fabrication operations according to embodiments of the invention;

FIG. 17A depicts a cross-sectional view of the semiconductor device taken along line X-X in FIG. 10A after fabrication operations according to embodiments of the invention;

FIG. 17B depicts a cross-sectional view of the semiconductor device taken along line Y-Y in FIG. 10A after fabrication operations according to embodiments of the invention; and FIG. 17C depicts a cross-sectional view of the semiconductor device taken along line Z-Z in FIG. 10A after fabrication operations according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, many local connections between gate and trench silicide are required for logical, analog, digital, and memory circuits. The local connection is referred to as an XC connection. As technology continues to shrink, the XC connection requires a critical hardmask open and presents a potential issue for short circuiting with other type connections. Particularly, there can be an issue of a gate and trench silicide short.

Turning now to an overview of the aspects of the invention, one or more embodiments of the invention provide semiconductor devices and a method of forming the semiconductor devices. Embodiments of the invention provide methods and structures of forming self-aligned embedded XC connections with recess spacers (e.g., local interconnect cap, gate cap, and/or trench silicide cap) to address issues above.

Turning now to a more detailed description of aspects of the present invention, FIG. 1A depicts a simple diagram of a top view of a semiconductor device 100 after an initial set of fabrication operations according to embodiments of the invention. For simplicity and ease of understanding, FIG. 1A omits some layers (elements) so as to expose underlying layers. Also, FIG. 1A illustrates some transparent layers (elements). In FIG. 1A, the dashed lines are representative of future locations of the combined local (XC) connection location and gate (CB) metal contact location on one fin, along with an individual gate (CB) metal contact location on another fin.

FIG. 1B depicts a cross-sectional view of the semiconductor device 100 shown in FIG. 1A taken along line X-X. FIG. 1C depicts a cross-sectional view of the semiconductor device 100 shown in FIG. 1A taken along line Y-Y. FIG. 1D depicts a cross-sectional view of the semiconductor device 100 shown in FIG. 1A taken along line Z-Z.

After initial fabrication processing, the semiconductor device 100 includes fins 102 with source and drain (SD) regions 104 formed on both sides of the fins 102. The fins 102 are formed of semiconductor material. The fins 102 can be a silicon substrate, although other materials can be used as the fins 102. The source/drain regions 104 can be epitaxially grown from the fins 102 and are semiconductor material. The source/drain regions 104 can be doped with P-type dopants or N-type dopants as desired. Two fins in parallel are shown in FIG. 1A, and FIG. 1A shows four S/D regions with two S/D regions on each of the two fins. A gate structure is formed which includes one or more high-k dielectric materials 106, one or more work function metals 108 formed on the high-k dielectric material 106, and a gate metal 112 formed on the work function metal 108. A gate spacer material 110 is formed on the sides of the high-k dielectric material 106, as best seen in FIGS. 1B and 1C. The gate spacer material 110 can be, for example, an oxide such as silicon dioxide, a nitride such as silicon nitride, etc.

The high-k dielectric material 106 can include one or more high-k materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include a dopant such as lanthanum or aluminum. High-k dielectric materials can have a dielectric constant greater than 3.9, 7.0, or 10.0.

The work function metal 108 can include one or more work function metals. The work function metal 108 can include P-type metals used for PFETs and N-type metals used for NFETs. Example work function metals can include TiN, TiC, TiCAl, TaN, or any other metals used in the state of the art. The gate metal 112 can include the example work function metals discussed herein and/or other metals including aluminum, copper, etc. The high-k dielectric material 106, the work function metal 108, and the gate metal 112 together form a gate stack or the gate structure.

A liner 114 is formed on the sides of the gate spacer material 110 and on the S/D regions 104. The liner 114 is a non-conductive material. The liner 114 can be, for example, silicon nitride. Other examples materials of the liner 114 can include SiOCN, SiBCN, SiC, SiOC, SiCN, BN, SiON, and combinations thereof.

A first metal liner 116 is formed on the liner 114 and the S/D regions 104. Example materials of the first metal liner 116 can include titanium nitride (TiN), tantalum nitride (TaN), hafnium nitride (HfN), niobium nitride (NbN), tungsten nitride (WN), or combinations thereof. A silicide or trench silicide (TS) 118 is formed on the first metal liner 116 to be over and electrically connect to the S/D regions 104. Although not shown in FIG. 1A, trench TS is on each of the (separate) four S/D regions in FIG. 1A such that two TS are on each of the fins just as two S/D regions are each of the fins. The trench silicide 118 is a conductive material. Example materials of the trench silicide 118 can include TiSix, WSix, CoSix, AlSix, etc.

A gate (or SAC) cap 120 is formed on top of the high-k dielectric material 106, the work function metal 108, and the gate metal 112 (which form the gate structure). The gate cap 120 is an insulator or very poor conductor, and the gate cap 120 can be an undoped dielectric material, such as, silicon nitride. Other example materials for the gate cap 120 can include SiOCN, SiOC, SiC, SIBCN, SiCN, BN, SiON, and combinations thereof.

FIG. 1D illustrates a liner 150 formed on the fins 102. The liner 150 can be, for example, silicon nitride (SiN). A dielectric material 152 is formed on the silicon nitride 152. The dielectric material 152 can be, for example, an oxide material such as silicon dioxide. Also, FIG. 1D illustrates insulator layer 154 separating the TS 118 (for example, one TS 118 on a fin and another TS 118 on another fin), and particularly, the insulator layer 154 is between the portions of the first metal liner 116. The insulator 154 can be oxide.

FIG. 2A depicts a cross-sectional view of the semiconductor device 100 taken along line X-X in FIG. 1A after fabrication operations according to embodiments of the invention. FIG. 2B depicts a cross-sectional view of the semiconductor device 100 taken along line Y-Y in FIG. 1A after fabrication operations according to embodiments of the invention. FIG. 2C depicts a cross-sectional view of the semiconductor device 100 taken along line Z-Z in FIG. 1A according to embodiments of the invention.

Etching is performed to recess the TS 118, polymer liner 114, first metal liner 116, along with a portion of gate spacer material 110, thereby leaving trenches (not shown) over the TS 118. Subsequently, these trenches are filled with the material of the TS caps 202 in FIGS. 2A, 2B, 2C, and chemical mechanical polishing/planarization (CMP) is performed to stop on the SAC cap 120. Example materials of the TS caps 202 can include SiOCN, SiOC, SiC, SIBCN, SiCN, BN, SiON, and combinations thereof. In some implementations, the SAC cap 120 is silicon nitride while the TS caps 202 are silicon oxycarbide. There are four TS caps 202, one on each of the four TS 118.

FIG. 3A depicts a cross-sectional view of the semiconductor device 100 taken along line X-X in FIG. 1A after fabrication operations according to embodiments of the invention. FIG. 3B depicts a cross-sectional view of the semiconductor device 100 taken along line Y-Y in FIG. 1A after fabrication operations according to embodiments of the invention. FIG. 3C depicts a cross-sectional view of the semiconductor device 100 taken along line Z-Z in FIG. 1A according to embodiments of the invention.

An inter-level dielectric (ILD) material 310 is formed on top of the semiconductor device 100 and CMP is performed to stop on target thickness. The ILD material 310 is a low-k dielectric material, such as, for example, a low-k oxide material (e.g., silicon dioxide). FIGS. 3A, 3B, and 3C show opening 302 for the future CB/XC location and opening 304 for the future CB location. To open up the future CB/XC location and future CB location, etching is performed to remove corresponding portions of ILD 302 and remove the SAC cap 120, for example, using reactive ion etching. Only one mask is utilized to (simultaneously) form the CB/XC opening 302 and the CB opening 304. Removing the SAC cap 120 exposes the gate structure of high-k dielectric material 106, the work function metal 108, and the gate metal 112.

FIG. 4A depicts a cross-sectional view of the semiconductor device 100 taken along line X-X in FIG. 1A after fabrication operations according to embodiments of the invention. FIG. 4B depicts a cross-sectional view of the semiconductor device 100 taken along line Y-Y in FIG. 1A after fabrication operations according to embodiments of the invention. FIG. 4C depicts a cross-sectional view of the semiconductor device 100 taken along line Z-Z in FIG. 1A according to embodiments of the invention.

The CB/XC opening 302 and the CB opening 304 are filled with a sacrificial material 402, as depicted in FIGS. 4A, 4B, and 4C. The sacrificial material 402 is a soft material, such as an organic planarization layer (OPL). One skilled in the art understands the difference between a soft material versus a hard material, which are both used patterning.

FIG. 5A depicts a cross-sectional view of the semiconductor device 100 taken along line X-X in FIG. 1A after fabrication operations according to embodiments of the invention. FIG. 5B depicts a cross-sectional view of the semiconductor device 100 taken along line Y-Y in FIG. 1A after fabrication operations according to embodiments of the invention. FIG. 5C depicts a cross-sectional view of the semiconductor device 100 taken along line Z-Z in FIG. 1A according to embodiments of the invention.

A block mask 502 is deposited. Using selective RIE etching, the block mask 502 is opened over the combined CB/XC location as opening 504 but remains to protect the individual CB location. The block mask 502 is a hard material, such as, for example, silicon nitride.

FIG. 6A depicts a cross-sectional view of the semiconductor device 100 taken along line X-X in FIG. 1A after fabrication operations according to embodiments of the invention. FIG. 6B depicts a cross-sectional view of the semiconductor device 100 taken along line Y-Y in FIG. 1A after fabrication operations according to embodiments of the invention. FIG. 6C depicts a cross-sectional view of the semiconductor device 100 taken along line Z-Z in FIG. 1A according to embodiments of the invention. To form CB/XC opening 604, selective etching is performed to remove the exposed sacrificial material 402 in the CB/XC location via opening 504, as depicted in FIGS. 6A and 6C. The block mask 502 covers the CB location, thus protecting it during the etching.

FIG. 7A depicts a cross-sectional view of the semiconductor device 100 taken along line X-X in FIG. 1A after fabrication operations according to embodiments of the invention. FIG. 7B depicts a cross-sectional view of the semiconductor device 100 taken along line Y-Y in FIG. 1A after fabrication operations according to embodiments of the invention. FIG. 7C depicts a cross-sectional view of the semiconductor device 100 taken along line Z-Z in FIG. 1A according to embodiments of the invention. Selective RIE etching is performed through the TS cap 202 as shown in FIG. 7C. Also, etching continues into a portion of the (right) TS 118 which levels the TS 118 with the gate metal 112, as best seen in FIG. 7A. While etching, the CB location is protected by the block mask 502 in FIG. 7B.

FIG. 8A depicts a cross-sectional view of the semiconductor device 100 taken along line X-X in FIG. 1A after fabrication operations according to embodiments of the invention. FIG. 8B depicts a cross-sectional view of the semiconductor device 100 taken along line Y-Y in FIG. 1A after fabrication operations according to embodiments of the invention. FIG. 8C depicts a cross-sectional view of the semiconductor device 100 taken along line Z-Z in FIG. 1A according to embodiments of the invention. The block mask 502 and sacrificial material 402 are removed as depicted in FIGS. 8A, 8B, and 8C. Now, the individual CB opening 802 is available (concurrently) with the CB/XC opening 604. This is preparation for the metal deposition.

FIG. 9A depicts a simple diagram of a top view of the semiconductor device 100 after fabrication operations according to embodiments of the invention. For simplicity and ease of understanding, FIG. 9A omits layers (elements) so as to expose underlying layers. Also, FIG. 9A illustrates some transparent layers (elements). In FIG. 9A, the combined gate (CB) metal contact and local (XC) metal connection has been formed and the individual gate (CB) metal contact has been formed, thus the dashed lines are replaced with solid lines. FIG. 9B depicts a cross-sectional view of the semiconductor device 100 taken along line X-X in FIG. 9A according to embodiments of the invention. FIG. 9C depicts a cross-sectional view of the semiconductor device 100 taken along line Y-Y in FIG. 9A after fabrication operations according to embodiments of the invention. FIG. 9D depicts a cross-sectional view of the semiconductor device 100 taken along line Z-Z in FIG. 9A according to embodiments of the invention.

A metal liner 908 is deposited in the combined CB/XC opening 604 (depicted in FIGS. 8A and 8C) and in the individual CB opening 802 (depicted in FIGS. 8B and 8C). Example materials of the metal liner 908 can include titanium nitride (TiN), tantalum nitride (TaN), hafnium nitride (HfN), niobium nitride (NbN), tungsten nitride (WN), or combinations thereof. Metal is deposited on the metal liner 908 to form the combined CB gate metal contact and XC local connection 902 and the individual CB gate metal contact 904. Example metals of the local connection can include tungsten, copper, cobalt. In some implementations, the metal liner 908 is not utilized. The purpose of the metal liner 908 is to prevent the metal ions from diffusing into dielectric 310.

FIG. 10A depicts a simple diagram of a top view of a semiconductor device 1000 after an initial set of fabrication operations according to embodiments of the invention. For simplicity and ease of understanding, FIG. 10A omits some layers (elements) so as to expose underlying layers. Also, FIG. 10A illustrates some transparent layers (elements). In FIG. 10A, the dashed lines are representative of future locations of the combined local (XC) connection location and S/D (CA) metal contact location, along with an individual S/D (CA) metal contact location.

FIG. 10B depicts a cross-sectional view of the semiconductor device 1000 shown in FIG. 10A taken along line X-X. FIG. 10C depicts a cross-sectional view of the semiconductor device 1000 shown in FIG. 10A taken along line Y-Y. FIG. 10D depicts a cross-sectional view of the semiconductor device 1000 shown in FIG. 10A taken along line Z-Z. FIGS. 10B and 10C are similar to FIGS. 2A and 2B, while FIG. 10D is similar to FIG. 2C except for having different shaped S/D regions 104. Accordingly, description and fabrication processing is not repeated.

FIG. 11A depicts a cross-sectional view of the semiconductor device 1000 taken along line X-X in FIG. 10A after fabrication operations according to embodiments of the invention. FIG. 11B depicts a cross-sectional view of the semiconductor device 1000 taken along line Y-Y in FIG. 10A after fabrication operations according to embodiments of the invention. FIG. 11C depicts a cross-sectional view of the semiconductor device 1000 taken along line Z-Z in FIG. 10A according to embodiments of the invention.

As discussed herein, the ILD material 310 is formed on top of the semiconductor device 1000 and CMP is performed to stop on the target thickness. The ILD material 310 is a low-k dielectric material, such as, for example, a low-k oxide material (e.g., silicon dioxide). FIGS. 11A, 11B, and 11C show opening 1102 for the future CA/XC location and opening 1104 for the future CA location. To open up the future CA/XC location and future CA location, etching is performed to remove corresponding portions of ILD 310 and remove the (right) TS caps 202 in FIGS. 11A and 11B, for example, using reactive ion etching. Only one mask is utilized to form the CA/XC opening 1102 and the CA opening 1104. Removing the (right) TS caps 202 exposes the (right) TS 118 on the respective fins 102 in FIGS. 11A and 11B. Removing the two TS caps 202 exposes the SAC cap 120 in FIG. 11C.

FIG. 12A depicts a cross-sectional view of the semiconductor device 1000 taken along line X-X in FIG. 10A after fabrication operations according to embodiments of the invention. FIG. 12B depicts a cross-sectional view of the semiconductor device 1000 taken along line Y-Y in FIG. 10A after fabrication operations according to embodiments of the invention. FIG. 10C depicts a cross-sectional view of the semiconductor device 1000 taken along line Z-Z in FIG. 10A after fabrication operations according to embodiments of the invention.

The CA/XC opening 1102 and the CB opening 1104 are filled with a sacrificial material 402, as depicted in FIGS. 12A, 12B, and 12C. The sacrificial material 402 is a soft material, such as an organic planarization layer (OPL). One skilled in the art understands the difference between a soft material versus a hard material, which are both used patterning.

FIG. 13A depicts a cross-sectional view of the semiconductor device 1000 taken along line X-X in FIG. 10A after fabrication operations according to embodiments of the invention. FIG. 13B depicts a cross-sectional view of the semiconductor device 1000 taken along line Y-Y in FIG. 10A after fabrication operations according to embodiments of the invention. FIG. 13C depicts a cross-sectional view of the semiconductor device 1000 taken along line Z-Z in FIG. 10A after fabrication operations according to embodiments of the invention.

A block mask 502 is deposited on top of the semiconductor device 100. Using selective RIE etching, the block mask 502 is then opened over the combined CA/XC location in FIGS. 13A and 13C but remains to protect the individual CB location in FIGS. 13B and 13C. The block mask 502 is a hard material, such as, for example, silicon nitride.

FIG. 14A depicts a cross-sectional view of the semiconductor device 1000 taken along line X-X in FIG. 10A after fabrication operations according to embodiments of the invention. FIG. 14B depicts a cross-sectional view of the semiconductor device 1000 taken along line Y-Y in FIG. 10A after fabrication operations according to embodiments of the invention. FIG. 14C depicts a cross-sectional view of the semiconductor device 1000 taken along line Z-Z in FIG. 10A after fabrication operations according to embodiments of the invention. To form CA/XC opening 1402 in FIGS. 14A and 14C, selective etching is performed to remove the exposed sacrificial material 402 in the CA/XC location via the previous opening shown in FIGS. 13A and 13C. The block mask 502 covers the CB location in FIG. 14B, thus protecting it during the etching.

FIG. 15A depicts a cross-sectional view of the semiconductor device 1000 taken along line X-X in FIG. 10A after fabrication operations according to embodiments of the invention. FIG. 15B depicts a cross-sectional view of the semiconductor device 1000 taken along line Y-Y in FIG. 10A after fabrication operations according to embodiments of the invention. FIG. 15C depicts a cross-sectional view of the semiconductor device 1000 taken along line Z-Z in FIG. 10A after fabrication operations according to embodiments of the invention.

To further open/etch down into the CA/XC opening 1402, selective RIE etching is performed through the SAC cap 120 and through a portion of the gate metal 112 as shown in FIG. 15C. FIG. 15A also shows etching through a portion of the SAC cap 120 and into part of the gate metal 112, making the gate metal 112 level with the right TS 118, thereby further opening CA/XC opening 1420. The individual CA location is still protected by the block mask 502 in FIG. 15B.

FIG. 16A depicts a cross-sectional view of the semiconductor device 1000 taken along line X-X in FIG. 10A after fabrication operations according to embodiments of the invention. FIG. 16B depicts a cross-sectional view of the semiconductor device 1000 taken along line Y-Y in FIG. 10A after fabrication operations according to embodiments of the invention. FIG. 16C depicts a cross-sectional view of the semiconductor device 1000 taken along line Z-Z in FIG. 10A after fabrication operations according to embodiments of the invention. The block mask 502 and remaining sacrificial material 402 are removed as depicted in FIGS. 16A, 16B, and 16C. Now, the individual CA opening 1602 is available (concurrently) with the combined CA/XC opening 1402. This is preparation for the metal deposition.

FIG. 17A depicts a cross-sectional view of the semiconductor device 1000 taken along line X-X in FIG. 10A after fabrication operations according to embodiments of the invention. FIG. 17B depicts a cross-sectional view of the semiconductor device 1000 taken along line Y-Y in FIG. 10A after fabrication operations according to embodiments of the invention. FIG. 17C depicts a cross-sectional view of the semiconductor device 1000 taken along line Z-Z in FIG. 10A after fabrication operations according to embodiments of the invention.

The metal liner 908 is deposited in the combined CA/XC opening 1402 (depicted in FIGS. 16A and 16C) and in the CA opening 1602. Example materials of the metal liner 908 can include titanium nitride (TiN), tantalum nitride (TaN), hafnium nitride (HfN), niobium nitride (NbN), tungsten nitride (WN), or combinations thereof. Metal is deposited on the metal liner 908 to form the combined CA (S/D) metal contact and XC local connection 1702 and the individual CA (S/D) metal contact 1704. Example metals of the local connection can include tungsten, copper, cobalt. In some implementations, the metal liner 908 is not utilized. The purpose of the metal liner 908 is to prevent the metal ions from diffusing into dielectric 310.

According to embodiments of the invention, a method of forming a semiconductor device 100 is provided. The method includes forming a first (left) trench silicide (TS) 118 coupled to a first source or drain (S/D) 104 over a first fin 102 (in FIG. 1B), a second (right) TS 118 coupled to a second S/D 102 on the first fin (in FIG. 1B), a third (left) TS 118 coupled to a third S/D 104 over a second fin 102 (in FIG. 1C), a fourth (right) TS 118 coupled to a fourth S/D 104 over the second fin 102 (in FIG. 1C), a gate metal 112 over the first and second fins 102, and a gate cap 120 over the gate metal 112. The method includes forming a first (left) TS cap 202 on the first (left) TS 118, a second (right) TS cap 202 on the second (right) TS 118 in FIG. 2A, a third (left) TS cap 202 on the third (left) TS 118, and fourth (right) TS cap 202 on the fourth (right) TS 118 in FIG. 2B. The method includes forming an inter-level dielectric (ILD) 310 on top of the gate cap 120 and the first, second, third and fourth TS caps 202. The method includes forming a first opening 604 through the ILD 310 and the second TS cap 202 such that part of the gate metal 112 is exposed, after removing part of the gate cap 120 in FIG. 8A. The method includes forming a second opening 802 through the ILD 310 to expose another part of the gate metal 112 in FIG. 8B. The method includes forming a combined gate metal contact and local metal connection (CB/XC) 902 in the first opening 604 (in FIG. 9B) and individual gate metal contact 904 in the second opening 802 (in FIG. 9C).

The combined gate metal contact and local metal connection 902 electrically couples to the gate metal 112. The combined gate metal contact and local metal connection 902 electrically couples to the second (right) TS 118 on the first fin 102 in FIG. 9B. The combined gate metal contact and local metal connection 902 electrically couples the gate metal 112 and the second (right) S/D 104 on the first fin 102 in FIG. 9B. The individual gate metal contact 904 electrically couples to the gate metal 112 in FIG. 9C. A metal liner 908 is deposited prior to forming the combined gate metal contact and local metal connection 902 in the first opening. A metal liner 908 is deposited prior to forming the individual gate metal contact 904 in the second opening.

According to embodiments of the invention, a method of forming a semiconductor device 1000 is provided. The method includes forming a first (left) trench silicide (TS) 118 coupled to a first (left) source or drain (S/D) 104 over a first fin 102, a second (right) TS 118 coupled to a second (right) S/D 104 over the first fin 102 in FIG. 10B, a third (left) TS 118 coupled to a third (left) S/D 104 over a second fin 102, a fourth (right) TS 118 coupled to a fourth (right) S/D 104 over the second fin 102 in FIG. 10C, a gate metal 112 over the first and second fins, and a gate cap 120 over the gate metal 112. The method includes forming a first (left) TS cap 202 on the first (left) TS 118, a second (right) TS cap 202 on the second (right) TS 118 in FIG. 10B, a third (left) TS cap 202 on the third (left) TS 118, and fourth (right) TS cap 202 on the fourth (right) TS 118 in FIG. 10C. The method includes forming an inter-level dielectric (ILD) 310 on top of the gate cap 120 and the first, second, third and fourth TS caps 202. Also the method includes forming a first opening 1402 through the ILD, the SAC cap, and the second TS cap such that part of the gate metal and the second TS are exposed as depicted in FIG. 16A and forming a second opening 1602 through the ILD and the fourth TS cap to expose the fourth TS in FIG. 16B. The method includes forming a combined S/D metal contact and local metal connection (CA/XC) 1702 in the first opening in FIGS. 17A and 17C and an individual S/D metal contact (CA) 1704 in the second opening in FIGS. 17B and 17C.

The combined S/D metal contact and local metal connection 1702 electrically couples to the gate metal 112 in FIG. 17A. The combined S/D metal contact and local metal connection 1702 electrically couples to the second (right) TS 118 (in FIG. 17A) on the first fin 102 (top fin in FIG. 10A). The combined S/D metal contact and local metal connection 1702 electrically couples the gate metal 112 and the second (right) S/D 104 (in FIG. 17A) on the first fin 102 (top fin in FIG. 10A). The individual S/D metal contact electrically 1704 couples to the fourth (right) TS 118 (in FIG. 17B) on the second fin 102 (bottom fin in FIG. 10A).

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
   forming a gate over a first fin and a second fin;
   forming a first trench silicide (TS) over the first fin and a second TS over the second fin;
   forming a first metal electrically coupling the first TS to the gate over the first fin; and
   forming a second metal on the gate over the second fin so as to avoid electrically coupling to the second TS, wherein the first metal is a combined gate metal contact and local metal connection.

2. The method of claim 1, wherein:
   the gate separates the first TS into a first one part and a first another part over the first fin; and
   the gate separates the second TS into a second one part and a second another part over the second fin.

3. The method of claim 2, wherein:
   the first one part is coupled to a first one source or drain (S/D) and the first another part is coupled to a first another S/D over the first fin; and
   the second one part is coupled to a second one S/D and the second another part is coupled to a second another S/D over the second fin.

4. The method of claim 3, wherein the first metal electrically couples to one of the first one S/D or the first another S/D over the first fin.

5. The method of claim 1, wherein the second metal is an individual gate metal contact.

6. The method of claim 1, wherein a metal liner is formed on both the first TS and the gate such that the first metal is formed on the metal liner on the first fin.

7. The method of claim 1, wherein a metal liner is formed between the second metal and the gate on the second fin.

8. A semiconductor device comprising:
   a gate formed over a first fin and a second fin;
   a first trench silicide (TS) formed over the first fin and a second TS formed over the second fin;
   a first metal electrically coupling the first TS to the gate over the first fin; and
   a second metal formed on the gate over the second fin so as to avoid electrically coupling to the second TS, wherein the first metal is a combined gate metal contact and local metal connection.

9. The semiconductor device of claim 8, wherein:
   the gate separates the first TS into a first one part and a first another part over the first fin; and
   the gate separates the second TS into a second one part and a second another part over the second fin.

10. The semiconductor device of claim 9, wherein:
    the first one part is coupled to a first one source or drain (S/D) and the first another part is coupled to a first another S/D over the first fin; and
    the second one part is coupled to a second one S/D and the second another part is coupled to a second another S/D over the second fin.

11. The semiconductor device of claim 10, wherein the first metal electrically couples to one of the first one S/D or the first another S/D over the first fin.

12. The semiconductor device of claim 8, wherein the second metal is an individual gate metal contact.

13. The semiconductor device of claim 8, wherein a metal liner is formed on both the first TS and the gate such that the first metal is formed on the metal liner on the first fin.

14. The semiconductor device of claim 8, wherein a metal liner is formed between the second metal and the gate on the second fin.

15. A method of forming a semiconductor device, the method comprising:
   forming a gate over a first fin and a second fin;
   forming a first trench silicide (TS) over the first fin and a second TS over the second fin, the gate separating the first TS into a first one part and a first another part over the first fin, the gate separating the second TS into a second one part and a second another part over the second fin;
   forming a first metal electrically coupling the first one part of the first TS to the gate over the first fin; and
   forming a second metal coupled to one of the second one part or the second another part of the second TS so as to avoid electrically coupling to the gate.

16. The method of claim 15, wherein the first one part is coupled to a first one source or drain (S/D) and the first another part is coupled to a first another S/D over the first fin.

17. The method of claim 15, wherein the second one part is coupled to a second one S/D and the second another part is coupled to a second another S/D over the second fin.

18. The method of claim 16, wherein the first metal electrically couples to the first one S/D over the first fin.

\* \* \* \* \*